(12) United States Patent
Motoyama et al.

(10) Patent No.: US 7,688,086 B2
(45) Date of Patent: Mar. 30, 2010

(54) FABRICATION METHOD OF SEMICONDUCTOR INTEGRATED CIRCUIT DEVICE AND PROBE CARD

(75) Inventors: Yasuhiro Motoyama, Tokyo (JP);
Yoshimi Horigome, Tokyo (JP); Seigo Nakamura, Tokyo (JP); Iwao Natori, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/555,993

(22) Filed: Nov. 2, 2006

(65) Prior Publication Data

US 2007/0108997 A1    May 17, 2007

(30) Foreign Application Priority Data

Nov. 11, 2005    (JP)    ............................. 2005-327183

(51) Int. Cl.
*G01R 31/02*    (2006.01)

(52) U.S. Cl. ...................................................... 324/754

(58) Field of Classification Search ......... 324/754–765; 73/855–856
See application file for complete search history.

(56) References Cited

U.S. PATENT DOCUMENTS

| | | | | |
|---|---|---|---|---|
| 5,786,701 | A * | 7/1998 | Pedder | 324/754 |
| 6,174,744 | B1 * | 1/2001 | Watanabe et al. | 438/14 |
| 6,305,230 | B1 * | 10/2001 | Kasukabe et al. | 73/855 |
| 6,354,844 | B1 * | 3/2002 | Coico et al. | 439/66 |
| 6,603,323 | B1 * | 8/2003 | Miller et al. | 324/754 |
| 6,856,150 | B2 * | 2/2005 | Sporck et al. | 324/754 |
| 6,861,858 | B2 * | 3/2005 | Chen et al. | 324/755 |
| 6,897,666 | B2 * | 5/2005 | Swettlen et al. | 324/754 |
| 7,049,837 | B2 | 5/2006 | Kasukabe et al. | |
| 7,071,715 | B2 * | 7/2006 | Shinde et al. | 324/754 |
| 7,307,433 | B2 * | 12/2007 | Miller et al. | 324/754 |
| 2002/0132501 | A1 * | 9/2002 | Eldridge et al. | 439/66 |
| 2004/0183556 | A1 | 9/2004 | Wada et al. | |
| 2004/0239349 | A1 * | 12/2004 | Yamagishi et al. | 324/754 |
| 2005/0093565 | A1 | 5/2005 | Okamoto et al. | |
| 2005/0095734 | A1 | 5/2005 | Hasebe et al. | |
| 2006/0033515 | A1 * | 2/2006 | Haba | 324/754 |
| 2006/0192575 | A1 | 8/2006 | Kasukabe et al. | |

FOREIGN PATENT DOCUMENTS

| | | |
|---|---|---|
| EP | 0 999 451 A2 | 5/2000 |
| EP | 1 022 775 A1 | 7/2000 |

(Continued)

*Primary Examiner*—Ha Tran T Nguyen
*Assistant Examiner*—Richard Isla Rodas
(74) *Attorney, Agent, or Firm*—Miles & Stockbridge P.C.

(57) ABSTRACT

To provide a technique of firmly bringing a stylus and a test pad into contact with each other in carrying out a probe testing summarizingly for plural chips by using a prober having the stylus formed by a technique of manufacturing a semiconductor integrated circuit device, plane patterns of respective wirings are formed such that a wiring and a wiring electrically connected to the wiring or a wiring which is not electrically connected to the wiring overlap each other, and a plane pattern arranged with both of the wiring and the wiring is constituted at upper portions of probes. Further, patterns of the wirings are formed such that an interval of arranging the wirings and a density of arranging the wirings become uniform at respective wiring layers in a thin film sheet.

25 Claims, 37 Drawing Sheets

FOREIGN PATENT DOCUMENTS

| | | |
|---|---|---|
| JP | 7-283280 A | 10/1995 |
| JP | 8-50146 A | 2/1996 |
| JP | 8-201427 A | 8/1996 |
| JP | 10-308423 A | 11/1998 |
| JP | 11-23615 A | 1/1999 |
| JP | 11-97471 A | 4/1999 |
| JP | 2000-150594 A | 5/2000 |
| JP | 2001-159643 A | 6/2001 |
| JP | 2002-139554 A | 5/2002 |
| JP | 2004-132699 A | 4/2004 |
| JP | 2004-144742 A | 5/2004 |
| JP | 2004-157127 A | 6/2004 |
| JP | 2004-288672 A | 10/2004 |
| JP | 2005-24377 A | 1/2005 |
| JP | 2005-136246 A | 5/2005 |
| JP | 2005-136302 A | 5/2005 |
| JP | 2005-302917 A | 10/2005 |
| JP | 2006-32593 A | 2/2006 |
| JP | 2006-186120 A | 7/2006 |
| JP | 2006-294660 A | 10/2006 |
| JP | 2006-343182 A | 12/2006 |
| JP | 2007-005405 A | 1/2007 |
| JP | 2007-010600 A | 1/2007 |
| JP | 2007-101373 A | 4/2007 |
| JP | 2007-121152 A | 5/2007 |
| WO | WO 98/52218 A | 11/1998 |
| WO | WO 2006/054344 A1 | 5/2006 |
| WO | WO 2006/097982 A1 | 9/2006 |

\* cited by examiner

FABRICATION METHOD OF SEMICONDUCTOR INTEGRATED CIRCUIT DEVICE AND PROBE CARD

CROSS-REFERENCE TO RELATED APPLICATIONS

The disclosure of Japanese Patent Application No. 2005-327183 filed on Nov. 11, 2005 including the specification, drawings and abstract is incorporated herein by reference in its entirety.

BACKGROUND OF THE INVENTION

1. Field of the Invention

The present invention relates to a technique of manufacturing a semiconductor integrated circuit device and a probe card, particularly relates to a technique which is effective by being applied to an electric testing of a semiconductor integrated circuit which is carried out by bringing a stylus of a probe card into press contact with an electrode pad of a semiconductor integrated circuit device.

2. Description of Related Art

In Japanese Patent Application Laid-open Nos. 7-283280, 8-50146 (corresponding to International Publication No. WO 95/34000), 8-201427, 10-308423, 11-23615 (corresponding to U.S. Pat. No. 6,305,230), 11-97471 (corresponding to European Patent No. EP1022775), 2000-150594 (corresponding to European Patent No. EP0999451), 2001-159643, 2004-144742, 2004-132699, 2004-288672, 2005-24377, 2005-136302 and 2005-136246, a structure of a prober including a stylus (contact terminal), an insulating film and a leader wiring formed by using a technique of manufacturing a semiconductor integrated circuit device, a manufacturing method thereof, and a technique of enabling a probe testing by using the prober for a chip in which a test pad is formed with a narrow pitch are described.

There is a probe testing as a technique of testing a semiconductor integrated circuit device. The probe testing includes a function test for confirming whether the device is operated in accordance with a predetermined function, or a test for determining acceptable product/unacceptable product by carrying out a test of a DC operation characteristic and an AC operation characteristic. In a probe testing, there is used a technique of carrying out a probe testing in a wafer state from requests in correspondence with wafer delivery (quality differentiation), in correspondence with KGD (Known Good Die) (promotion of yield of MCP (Multi-Chip Package)), and a reduction in total cost.

In recent years, multifunction formation of a semiconductor integrated circuit device has been progressed and it has been promoted to fabricate plural circuits in a single piece of a semiconductor chip (hereinafter, simply described as chip). Further, in order to reduce fabrication cost of a semiconductor integrated circuit device, it has been promoted to miniaturize a semiconductor element and a wiring, reduce an area of a semiconductor chip (hereinafter, simply described as chip), and increase a number of acquired chips per sheet of a semiconductor wafer (hereinafter, simply described as wafer). Therefore, not only a number of test pads (bonding pads) is increased but also the test pads are arranged by a narrow pitch, and also an area of the test pad is reduced. When a prober having a stylus in a cantilever shape is going to be used for the probe testing, there is present a problem that it is difficult to install the stylus in accordance with a position of arranging the test pad since the test pads are arranged by a narrow pitch.

Further, in accordance with large capacity formation of a memory product constituting a kind of a semiconductor integrated circuit device, or an increase in a memory included logic product similarly constituting a kind of a semiconductor integrated circuit device, a time period required for testing a probe in a wafer state is increased. Therefore, it is requested to increase throughput of a probe testing in a wafer state. In order to increase the throughput, it is requested to shorten a time period required for testing per sheet of a wafer. For example, a time period T0 required for testing per sheet of a wafer is represented by T0=(T1+T2)×N+T3 when a time period required for one time testing of a testing apparatus is designated by notation T1, a time period required for index of a prober is designated by notation T2, a number of times of bringing a stylus (probe needle) provided to a prober into contact with a wafer (hereinafter, described as a number of times of touch down) is designated by notation N, and a time period required for interchanging a wafer is designated by notation T3. In view of the equation, in order to promote the throughput of the probe testing in the wafer state, it is a problem to reduce the number of times of touch down. Further, at high temperatures, there is increased an awaiting time period by an amount of a time period of finishing thermal bending.

The inventors have investigated on a technique of capable of realizing a probe testing even for a chip a test pad of which is formed by a narrow pitch by using a prober having a stylus formed by a technique of manufacturing a semiconductor integrated circuit device, and particularly investigated on a prober capable of carrying out a probe testing summarizingly for plural chips. In the investigation, the inventors have found the following problem.

That is, the stylus is a portion of a thin film probe formed by carrying out deposition of a metal film and a polyimide film and a patterning thereof by using a technique of manufacturing a semiconductor integrated circuit device, and is provided on a side of a main face of a thin film probe opposed to a chip constituting an object of testing. In probe testing, by, for example, a press piece comprising 42 alloy and having a flat press face, the thin film probe of a region formed with a stylus is pressed from a back face on a side opposed to the main face. At this occasion, when a difference is brought about in heights of tips of all of styluses and a height of a test pad corresponding thereto, there is a concern of a drawback of bringing about a test pad in correspondence with a stylus which cannot be brought into contact therewith. Therefore, in probe testing, a problem is posed by firmly bringing a test pad in correspondence with all the styluses into contact therewith.

Further, in order to form a thin film probe capable of carrying out probe testing summarizingly for plural chips, a number of wirings electrically connected to a stylus are led around in a thin film probe. Therefore, there is a concern of varying a wiring density in a thin film probe and deteriorating flatness of a thin film probe. When the flatness of the thin film probe is deteriorated, there poses a problem that when a thin film probe is pressed by a press piece in probe testing, a variation is brought about in heights of tips of styluses, and styluses having a low height of a tip cannot be brought into contact with a test pad.

SUMMARY OF THE INVENTION

It is an object of one representative invention described in the application to provide a technique using a prober having a stylus formed by a technique of manufacturing a semiconductor integrated circuit device and capable of firmly bringing the stylus and a test pad into contact with each other when a probe testing is carried out summarizingly for a plurality of chips.

An outline of a representative one of the invention described in the application is simply explained as follows.

1. According to the invention, there is provided a method of manufacturing a semiconductor integrated circuit device comprising the steps of:

(a) preparing a semiconductor wafer partitioned into a plurality of chip regions, formed with semiconductor integrated circuits to each of the chip regions, and formed with a plurality of first electrodes electrically connected to the semiconductor integrated circuits on a main face thereof;

(b) preparing a first card including a first sheet formed with a first wiring substrate formed with a first wiring, a plurality of contact terminals for being brought into contact with the first electrodes, a plurality of second wirings electrically connected to the contact terminals and a plurality of third wirings which are not electrically connected to the contact terminals, wherein the second wirings are electrically connected to the first wirings and front ends of the contact terminals are held by the first wiring substrate opposedly to the main face of the semiconductor wafer, and a press mechanism for pressing a first region of the first sheet formed with the contact terminals from a back face side;

(c) carrying out an electric testing of the semiconductor integrated circuits by bringing the front ends of the contact terminals into contact with the first electrodes.

Here, the second wirings and the third wirings are formed by plural wiring layers in the first sheet; and wherein the second wirings or the third wirings are arranged at positions in correspondence with respective upper portions of the contact terminals in the respective plural wiring layers.

2. Further, according to the invention, there is provided a method of manufacturing a semiconductor integrated circuit device comprising the steps of:

(a) preparing a semiconductor wafer partitioned into a plurality of chip regions, formed with semiconductor integrated circuits to each of the chip regions, and formed with a plurality of first electrodes electrically connected to the semiconductor integrated circuits on a main face thereof;

(b) preparing a first card including a first sheet formed with a first wiring substrate formed with a first wiring, a plurality of contact terminals for being brought into contact with the first electrodes, a plurality of second wirings electrically connected to the contact terminals and a plurality of third wirings which are not electrically connected to the contact terminals, wherein the second wirings are electrically connected to the first wirings and front ends of the contact terminals are held by the first wiring substrate opposedly to the main face of the semiconductor wafer, and a press mechanism for pressing a first region of the first sheet formed with the contact terminals from a back face side;

(c) carrying out an electric testing of the semiconductor integrated circuits by bringing the front ends of the contact terminals into contact with the first electrodes.

Here, the second wirings and the third wirings are formed by plural wiring layers in the first sheet; and wherein only the second wirings included in the first wiring layer at a lowermost layer in the plural wiring layers are arranged at positions in correspondence with respective upper portions of the contact terminals in the first sheet.

3. Further, according to the invention, there is provided a method of manufacturing a semiconductor integrated circuit device comprising the steps of:

(a) preparing a semiconductor wafer partitioned into a plurality of chip regions, formed with semiconductor integrated circuits to each of the chip regions, and formed with a plurality of first electrodes electrically connected to the semiconductor integrated circuits on a main face thereof;

(b) preparing a first card including a first sheet formed with a first wiring substrate formed with a first wiring, a plurality of contact terminals for being brought into contact with the first electrodes, a plurality of second wirings electrically connected to the contact terminals and a plurality of third wirings which are not electrically connected to the contact terminals, wherein the second wirings are electrically connected to the first wirings and front ends of the contact terminals are held by the first wiring substrate opposedly to the main face of the semiconductor wafer, and a press mechanism for pressing a first region of the first sheet formed with the contact terminals from a back face side;

(c) carrying out an electric testing of the semiconductor integrated circuits by bringing the front ends of the contact terminals into contact with the first electrodes.

Here, the second wirings and the third wirings are formed by one wiring layer in the first sheet; and wherein the (c) step is carried out summarizingly for two or more of the chip regions aligned to be remote from each other by one or more part of the chip regions in the semiconductor wafer.

4. Further, according to the invention, there is provided a probe card comprising:

a first wiring substrate formed with a first wiring;

a first sheet formed with a plurality of contact terminals for being brought into contact with a plurality of first electrodes formed at a main face of a semiconductor wafer, a plurality of second wirings electrically connected to the contact terminals and a plurality of third wirings which are not electrically connected to the contact terminals, wherein the second wirings are electrically connected to the first wirings and front ends of the contact terminals are held by the first wiring substrate opposedly to the main face of the semiconductor wafer; and a press mechanism for pressing a first region of the first sheet formed with the contact terminals from a back face side;

wherein the second wirings and the third wirings are formed by plural wiring layers in the first sheet; and wherein the second wirings or the third wirings are arranged at positions in correspondence with respective upper portions of the contact terminals in each of the plural wiring layers.

5. Further, according to the invention, there is provided a probe card comprising:

a first wiring substrate formed with a first wiring;

a first sheet formed with a plurality of contact terminals for being brought into contact with a plurality of first electrodes formed at a main face of a semiconductor wafer, a plurality of second wirings electrically connected to the contact terminals and a plurality of third wirings which are not electrically connected to the contact terminals, wherein the second wirings are electrically connected to the first wirings and front ends of the contact terminals are held by the first wiring substrate opposedly to the main face of the semiconductor wafer; and a press mechanism for pressing a first region of the first sheet formed with the contact terminals from a back face side;

wherein the second wirings and the third wirings are formed by plural wiring layers in the first sheet; and wherein only the second wirings included in a first wiring layer of a lowermost layer in the plural wiring layers are arranged at positions in correspondence with respective upper portions of the contact terminals in the first sheet.

6. Further, according to the invention, there is provided a probe card comprising:

a first wiring substrate formed with a first wiring;

a first sheet formed with a plurality of contact terminals for being brought into contact with a plurality of first electrodes formed at a main face of a semiconductor wafer, a plurality of second wirings electrically connected to the contact terminals and a plurality of third wirings which are not electrically connected to the contact terminals, wherein the second wirings are electrically connected to the first wirings and front ends of the contact terminals are held by the first wiring substrate opposedly to the main face of the semiconductor wafer; and a press mechanism for pressing a first region of the first sheet formed with the contact terminals from a back face side;

wherein the second wirings and the third wirings are formed by one wiring layer in the first sheet; and wherein the first electrodes with which the contact terminals are brought into contact in one motion are formed in the chip regions selected in the semiconductor wafer and aligned to be remote from each other by one or more part of the chip regions.

An effect achieved by the representative one of the invention described in the application will simply be explained as follows.

(1) In a thin film probe including plural contact terminals or probes integrally formed with wiring layers and a front end portion electrically connected thereto and including plural wiring layers by a patterning method similar to that using a silicon wafer in manufacturing a semiconductor integrated circuit, plane patterns of respective wirings are formed such that wirings are overlapped in planes by upper and lower wiring layers and therefore, a thickness of the thin film probe can be made to be uniform at an upper portion of each contact terminal or probe. Thereby, the respective contact terminals or probes and test pads provided at plural chips constituting a testing object can firmly be brought into contact with each other.

(2) In a thin film probe including plural contact terminals or probes integrally formed with wiring layers and front end portions electrically connected thereto and including plural wiring layers by a patterning method similar to that using a silicon wafer in manufacturing a semiconductor integrated circuit, patterns of wirings are formed such that an interval of arranging the wirings and a density of arranging the wirings become uniform in the respective wiring layers and therefore, a thickness and a rigidity of the thin film probe can be made to be uniform at an upper portion of each contact terminal or probe. Thereby, the thin film probe can be prevented from being wrinkled and bent in the vicinity of each contact terminal or probe and therefore, a performance of bringing the respective contact terminals or probes and test pads provided at plural chips constituting a testing object into contact with each other can be promoted.

DETAILED DESCRIPTION OF THE PREFERRED EMBODIMENTS

Figure 1:
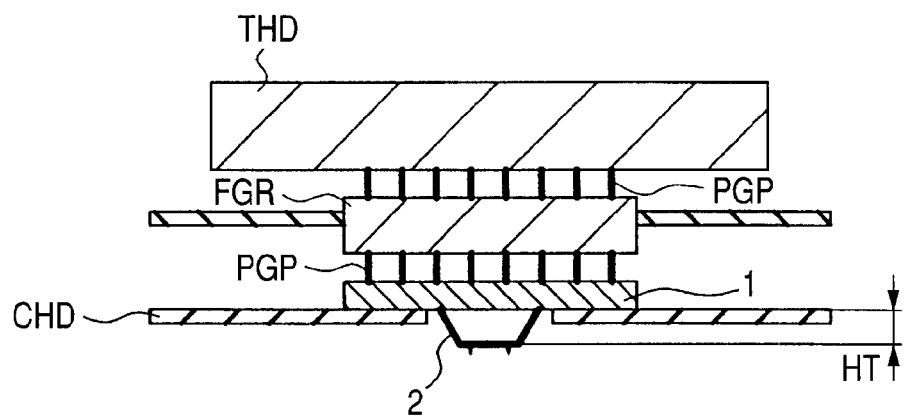
FIG. 1 is a sectional view of an essential portion of a probe card according to Embodiment 1 of the invention.

Before explaining the invention in details, significances of technical terms in the application will be explained as follows.

A wafer signifies a single crystal silicon substrate (generally, substantially in a plane circular shape), an SOI (Silicon On Insulator) substrate, an epitaxial substrate, a sapphire substrate, a glass substrate, other insulating, semi-insulating or semiconductor substrate as well as a composite substrate of these used in manufacturing an integrated circuit. Further, when a semiconductor integrated circuit device is referred in the application, the device includes not only a semiconductor integrated circuit device fabricated on a semiconductor or an insulating substrate of a silicon wafer or a sapphire substrate but also a semiconductor integrated circuit device formed on an insulating substrate of glass or the like such as TFT (Thin Film Transistor) as well as STN (Super-Twisted-Nematic) liquid crystal except in a case of being indicated clearly as otherwise.

A device face signifies a main face of a wafer and a face formed with a device pattern in correspondence with plural chip regions by lithography at the face.

A contact terminal or a probe signifies those integrally formed with a wiring layer and a front end portion electrically connected thereto by a patterning method integrated with a wafer process, that is, photolithography technique, CVD (Chemical Vapor Deposition) technique, sputtering technique and etching technique similar to those used in using a silicon wafer in manufacturing a semiconductor integrated circuit.

A contact terminal or a probe signifies a needle, a probe, or a projection for testing an electric property by being brought into contact with an electrode pad provided on each chip region.

A thin film probe (membrane probe), a thin film probe card, or a projected needle wiring sheet composite member signifies a thin film provided with the contact terminal (projected needle) brought into contact with a testing object as described above and a wiring led around therefrom, and formed with an electrode for being brought into contact with outside at the wiring, and signifies those having a thickness of about 10 µm through 100 µm, integrally formed with a wiring layer and a front end portion (contact terminal) electrically connected thereto by a patterning method combined with a wafer process, that is, photolithography technique, CVD (Chemical Vapor Deposition) technique, sputtering technique and etching technique similar to those using a silicon wafer in manufacturing a semiconductor integrated circuit. Although naturally the process becomes complicated, it is also possible to form portions thereof separately to be integrated later.

A probe card signifies a structure having a contact terminal brought into contact with a wafer constituting a testing object and a multilayer wiring substrate, a prober or a semiconductor testing apparatus signifies a testing apparatus having a sample supporting system including a wafer stage mounted with a frog ring, a probe card and a wafer constituting a testing object.

Probe testing signifies an electric test carried out by using a prober for a wafer finished with a wafer step, for carrying out an electric testing of a semiconductor integrated circuit by touching a front end of the contact terminal to an electrode formed on the main face of a chip region for determining acceptable product/unacceptable product by carrying out a function test for confirming whether the circuit is operated in accordance with a predetermined function or a test of DC operation characteristic and an AC operation characteristic. The probe testing is differentiated from a selecting test (final test) carried out after dividing a wafer to respective chips (or after packaging is finished).

A POGO pin or a spring probe signifies a contact needle having a structure of pressing a contact pin (plunger (contact needle)) to an electrode (terminal) by an elastic force of a spring (coil spring) for being electrically connected to the electrode as necessary, and is constructed by a constitution of transmitting an elastic force to the contact pin by the spring arranged at inside of a tube (holding member) made of a metal by way of a metal ball.

A tester (Test System) is for electrically testing a semiconductor integrated circuit for generating a predetermined voltage and a signal of a timing constituting a reference.

A tester head signifies those electrically connected to a tester, receiving a voltage and a signal transmitted from a tester for generating a voltage and a signal of a detailed timing to a semiconductor integrated circuit to transmit a signal to a probe card by way of a POGO pin.

A frog ring signifies those electrically connected with a tester head and a probe card by way of a POGO pin for transmitting a signal transmitted from a tester head to a probe card, mentioned later.

Although an explanation will be given by being divided into plural sections or embodiments when needed for convenience of explanation in the following embodiments, these are not unrelated to each other but one thereof is brought into a relationship of a portion of other or a modified example, details, a supplementary explanation of a total except a case clearly indicated otherwise particularly.

Further, in the following embodiments, in a case of referring to a number of elements (including a number of pieces, a numerical value, an amount, a range and the like), except a case clearly indicated otherwise and a case of being limited to a specific number clearly in principle, the number is not limited to the specific number but may be equal to or larger or equal to or smaller than the specific number.

Further, in the following embodiments, a constituent element thereof (including an element step and the like) is not necessarily indispensable naturally except a case clearly indicated otherwise particularly and a case of being conceivable as indispensable clearly in principle.

Similarly, in the following embodiments, when a shape, or a positional relationship of a constituent element is referred to, those substantially proximate to or similar to the shape or the like is included except a case of being clearly indicated otherwise particularly, and a case of being conceivable otherwise clearly in principle. The same goes with the numerical value and the range.

Further, when a material is referred to, except a case of being clearly described otherwise particularly, or a case of being conceived otherwise in principle or in view of a situation thereof, a specified material is a principal material and does not exclude a secondary element, an additive, or an additive element. For example, a silicon member includes not only pure silicon but also an additive impurity, a binary, or a ternary alloy (for example, SiGe) constituting a principal element by silicon except a case of being clearly indicated otherwise particularly.

Further, in all of the drawings for explaining the embodiments, those having the same functions are attached with the same notations and a repeated explanation thereof will be omitted.

Further, in all of the drawings for explaining the embodiments, in order to make constitutions of respective members easy to understand, there is a case of being hatched even in a plane view.

Further, respective details of a thin film probe by a semiconductor lithography technique used in the application are described in the following Patent Application by the inventors and related inventors and therefore, content thereof is not repeated except when needed particularly. The Patent Applications are Japanese Patent Application No. 6-22885, Japanese Patent Application Laid-open Nos. 7-283280, 8-50146 and 8-201427, Japanese Patent Application No. 9-119107, Japanese Patent Application Laid-open Nos. 11-23615, 2002-139554, and 10-308423, Japanese Patent Application No. 9-189660, Japanese Patent Application Laid-open Nos. 11-97471, 2000-150594 and 2001-159643, Japanese Patent Application No. 2002-289377 (corresponding U.S. patent application Ser. No. 10/676,609; US filing date: Oct. 2, 2003), Japanese Patent Application Laid-open Nos. 2004-132699, 2005-24377, 2004-288672 (corresponding U.S. patent application Ser. No. 10/765, 917; US filing date: Jan. 29, 2004), 2004-144742 (corresponding U.S. patent application Publication No. 2004/070,413), 2004-157127, 2004-144742 (corresponding U.S. patent application Publication No. 2004/070,413), 2004-157127, 2005-136246 (corresponding U.S. patent application Ser. No. 10/968,215; US filing date: Oct. 20, 2004) and 2005-136302 (corresponding U.S. patent application Ser. No. 10/968,431; US filing date Oct. 20, 2004), Japanese Patent Application No. 2004-115048, Japanese Patent Application No. 2004-208213, International Application No. PCT/JP2004/17160, International Application No. PCT/JP2005-4344, Japanese Patent Application No. 2004-378504, Japanese Patent Application No. 2005-109350, Japanese Patent Application No. 2005-168112, Japanese Patent Application No. 2005-181085, Japanese Patent Application No. 2005-194561, Japanese Patent Application No. 2005-291886, and Japanese Patent Application No. 2005-315115.

A detailed explanation will be given of embodiments of the invention in reference to the drawings as follows.

Embodiment 1

FIG. 1 is a sectional view of an essential portion of a probe card (first card) of Embodiment 1. As shown by FIG. 1, the probe card of Embodiment 1 is formed by a multilayer wiring substrate (first wiring substrate) 1, a thin film sheet (first sheet) 2, a tester head THD, a frog ring FGR and a card holder CHD. The tester head THD and the frog ring FGR as well as the frog ring FGR and the multilayer wiring substrate 1 are electrically connected respectively by way of pluralities of pieces of POGO pins PGP to thereby electrically connect the tester head THD and the multilayer wiring substrate 1. The card holder CHD is for mechanically connecting the multilayer wiring substrate 1 to a prober and is provided with a mechanical strength of preventing the multilayer wiring substrate 1 from being warped by a pressure from the POGO pin PGP.

Figure 2:
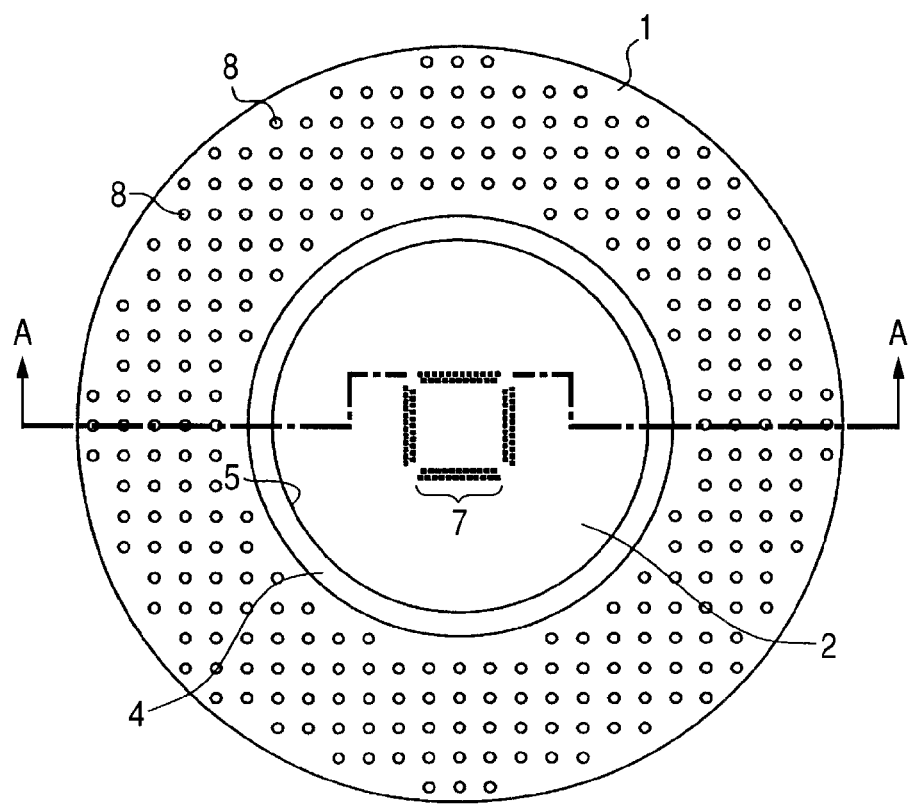
FIG. 2 is a plane view of an essential portion of a lower face of a probe card according to Embodiment 1 of the invention.
Figure 3:
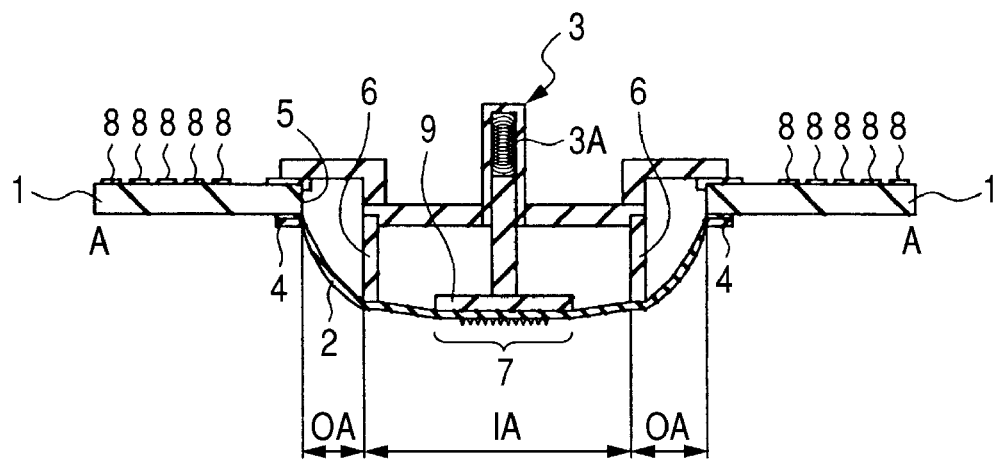
FIG. 3 is a sectional view taken along a line A-A of FIG. 2.

FIG. 2 a plane view of an essential portion of a lower face of the probe card of Embodiment 1, FIG. 3 is a sectional view taken along a line A-A of FIG. 2.

As shown by FIG. 2 and FIG. 3, the probe card of the embodiment includes, for example, a plunger 3 other than the members shown in FIG. 1. The thin film sheet 2 is fixed to a lower face of the multilayer wiring substrate 1 by a hold ring 4, and the plunger 3 is attached to an upper face of the multilayer wiring substrate 1. A center portion of the multilayer wiring substrate 1 is provided with an opening portion 5 and the thin film sheet 2 and the plunger 3 are adhered by way of an adhering ring 6 at inside of the opening portion 5.

A lower face of the thin film sheet 2 is formed with plural probes (contact terminals) 7 in, for example, a shape of a quadrangular pyramid or a shape of a frustrum of a quadrangular pyramid. Inside of the thin film sheet 2 is formed with plural wirings (second wirings) connecting electrically with the respective probes 7 and extended from the respective probes 7 to deep portions of the thin film sheet 2. The lower face or the upper face of the multilayer wiring substrate 1 is formed with plural receiving portions (illustration of which is omitted) which is respectively electrically in contact with end portions of the plural wirings, and the plural receiving portions are electrically connected to plural POGO seats 8 provided at the upper face of the multilayer wiring substrate 1 by way of wirings (first wirings) formed at inside of the multilayer wiring substrate 1. The POGO seat 8 is provided with a function of receiving a pin for introducing a signal from a tester to the probe card.

In Embodiment 1, the thin film sheet 2 is formed by a thin film whose major component is, for example, polyimide. The thin film sheet 2 is flexible and therefore, according to Embodiment 1, in order to bring all of the probes 7 into contact with pads of chips (semiconductor integrated circuit apparatus), there is constituted a structure in which the thin film sheet 2 at a region formed with the probes 7 (first region) is pressed by the plunger 3 by way of a press piece (press mechanism) 9 from the upper face (back face). That is, a constant pressure is applied to the press piece 9 by an elastic force of a spring 3A arranged at inside of the plunger 3. In the embodiment, as a material of the press piece 9, 42 alloy can be exemplified.

Here, when a number of press pads (bonding pads) formed at surfaces of the chips constituting a testing object is increased, a number of pieces of the POGO pins PGP for transmitting signals to each of the test pads is increased in accordance therewith. Further, by increasing the number of pieces of the POGO pins PGP, also pressures from the POGO pins PGP applied to the multilayer wiring substrate 1 are increased and therefore, the card holder CHD needs to be thickened in order to prevent the multilayer wiring substrate 1 from being warped. Further, when there is constituted a structure for applying a tension to each of a center region IA (refer to FIG. 3) of the thin film sheet 2 and an outer peripheral region OA (refer to FIG. 3) surrounding the center region IA constituting an outer peripheral side with respect to the adhering ring as a boundary, in order to firmly bring the respective probes 7 formed at the thin film sheet 2 into contact with corresponding test pads, a limit is brought about in a height HT (refer to FIG. 1) from a surface of the multilayer wiring substrate 1 to a probe face of the thin film sheet 2. When a thickness of the card holder CHD becomes larger than a limit value of the height HT, the thin film sheet 2 is embedded into the card holder CHD, and there is a concern of a drawback that the probe 7 cannot firmly be brought into contact with the test pad.

Hence, according to Embodiment 1, there is constituted a structure in which the thin film sheet 2 and the adhering ring 6 are adhered in a state in which a tension is applied only to the center region IA of the thin film sheet 2 and a tension is not applied to an outer peripheral region OA. In this case, it can be exemplified to select a metal (for example, 42 alloy) having a thermal expansion rate substantially the same as that of Si (silicon) as a material of the adhering ring 6 and use an epoxy species adhesive as adhesive for adhering the thin film sheet 2 and the adhering ring 6. Thereby, a height of the adhering ring 6 rectifying the height HT to the probe face of the thin film sheet 2 can be increased and therefore, also the height HT is increased and the drawback that the thin film sheet 2 is embedded into the card holder CHD can be avoided. That is, even when the card holder CHD becomes thick, the probe 7 can firmly be brought into contact with the test pad.

Figure 4:
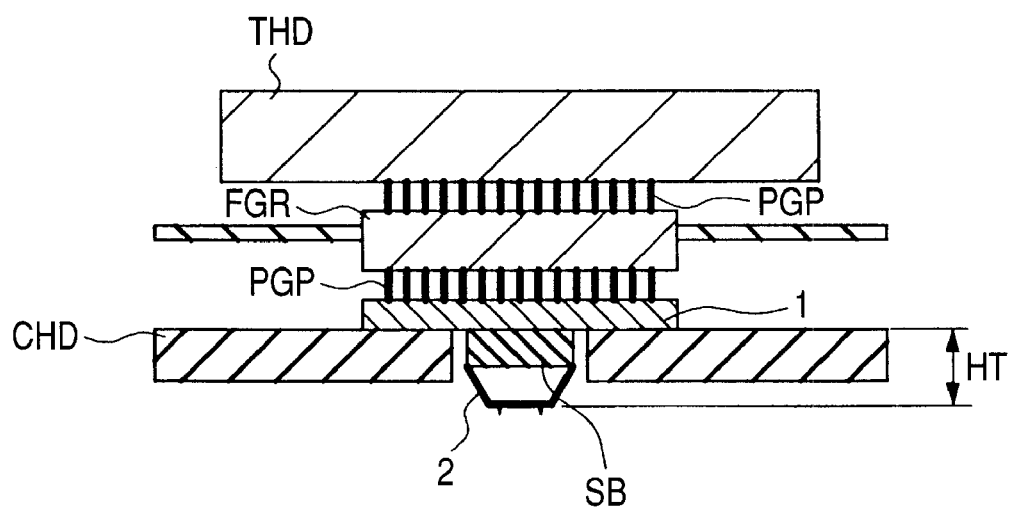
FIG. 4 is a sectional view of an essential portion of a probe card according to Embodiment 1 of the invention.

Instead of using the above-described means, as shown by FIG. 4, the height HT from the surface of the multilayer wiring substrate 1 to the probe face of the thin film sheet 2 may be increased by constituting a structure of attaching an auxiliary substrate SB to a center portion of the multilayer wiring substrate 1 and attaching the thin film sheet 2 to the auxiliary substrate SB. Similar to the multilayer wiring substrate 1, inside of the auxiliary substrate SB is formed with plural wirings, and formed with plural receiving portions (illustration of which is omitted) for being respectively brought into electric contact with end portions of the wirings. For example, respectively corresponding ones of the receiving portions provided at the multilayer wiring substrate 1 and the receiving portions provided at the auxiliary substrate SB are electrically connected by a solder. Instead of using the solder, these may be used means for bringing the multilayer wiring substrate 1 and the auxiliary substrate SB into press contact with each other by way of anisotropic conductive rubber, or means for forming projected portions made by Cu (copper) plating electrically connected to the receiving portions at respective surfaces of the multilayer wiring substrate 1 and the auxiliary substrate SB and bringing corresponding ones of the projected portions into press contact with each other.

Figure 5:
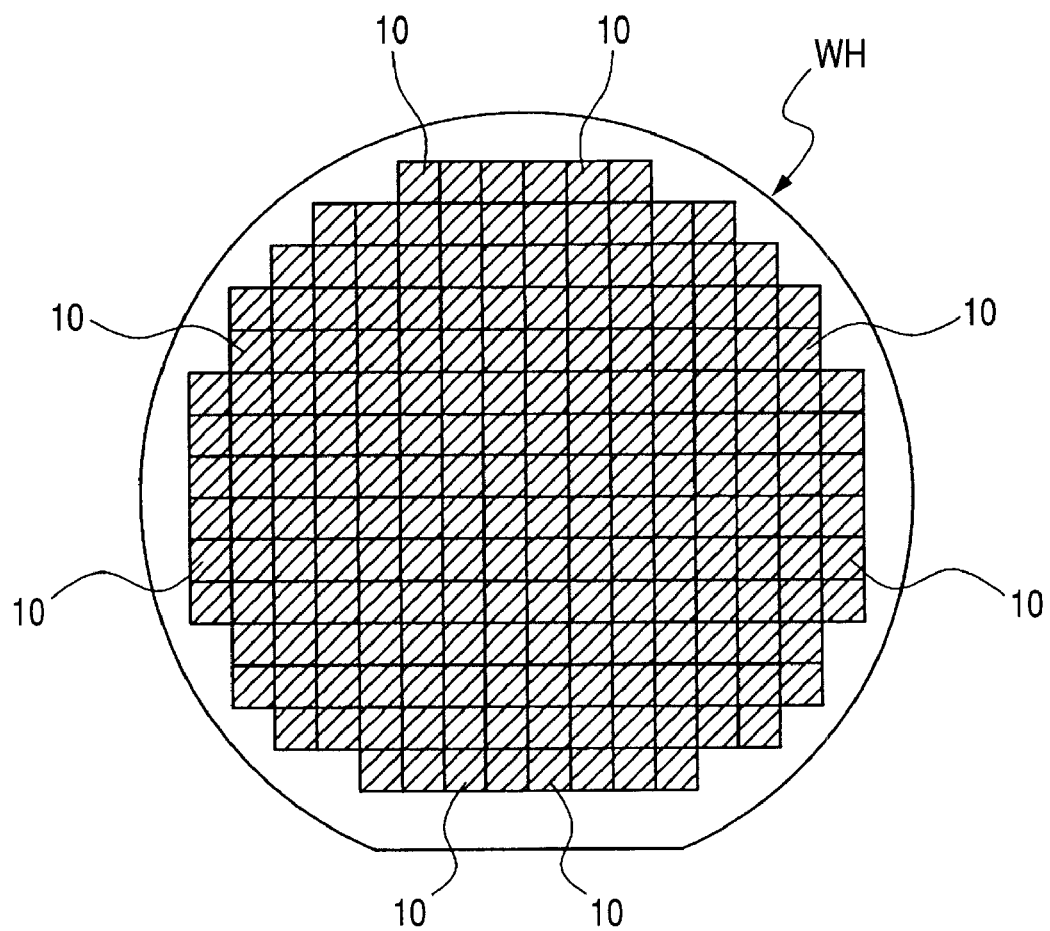
FIG. 5 is a plane view of a semiconductor wafer formed with a semiconductor chip region constituting an object of carrying out probe testing by using a probe card according to Embodiment 1 of the invention.
Figure 6:
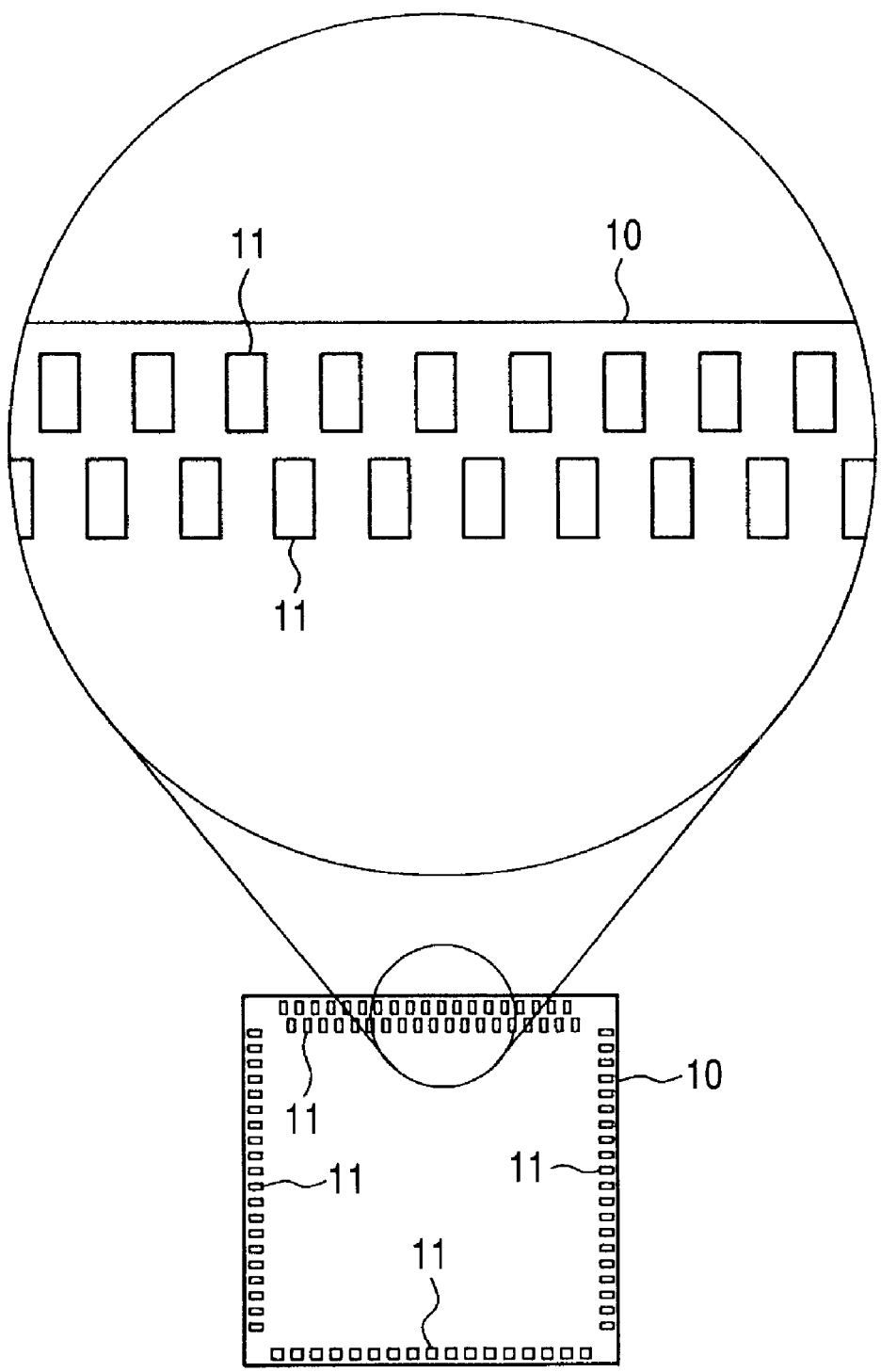
FIG. 6 is a plane view of a semiconductor chip constituting an object of carrying out probe testing by using a probe card according to Embodiment 1 of the invention.

In Embodiment 1, as an object of carrying out probe testing (electric testing) by using the probe card, a chip having a structure of SoC, (System on Chip) formed with a semiconductor integrated circuit having plural functions can be exemplified. FIG. 5 is a plane view of a wafer WH partitioned with plural chips (chip regions) 10 thereof. Further, probe testing using the probe card according to the embodiment is carried out for the wafer WH partitioned with the plural chips 10. Further, FIG. 6 illustrates a plane of the chip 10 and an enlarged portion thereof. The chip 10 comprises, for example, a single crystal silicon substrate a main face of which is formed with an LCD driver circuit. Further, a peripheral portion of the main face of the chip 10 is arranged with a number of pads (test pads (first electrodes)) 11 electrically connected to the semiconductor integrated circuit formed at inside of the chip 10. According to the pads 11 aligned in two rows along an outer periphery of the chip 10, in order to make an interval between the contiguous pads 11 as wide as possible, the pads 11 of the respective rows are aligned in zigzag along the outer periphery of the chip 10.

Further, the chip 10 can be fabricated by forming various semiconductor integrated circuits and input/output terminals (bonding pads) at a number of chip regions partitioned at the main face of the wafer by using a semiconductor manufacturing technique, successively forming the pads 11 on the input/output terminals by the above-described method, thereafter segmenting chip regions by dicing the wafer. Further, in Embodiment 1, the above-described probe testing is carried out for the respective chip regions before dicing the wafer. Further, hereinafter, in explaining the probe testing (a step of bringing the pads 11 and the probe 7 into contact with each other), the chips 10 designate the respective chip regions before dicing the wafer when not clearly described otherwise particularly.

Figure 7:
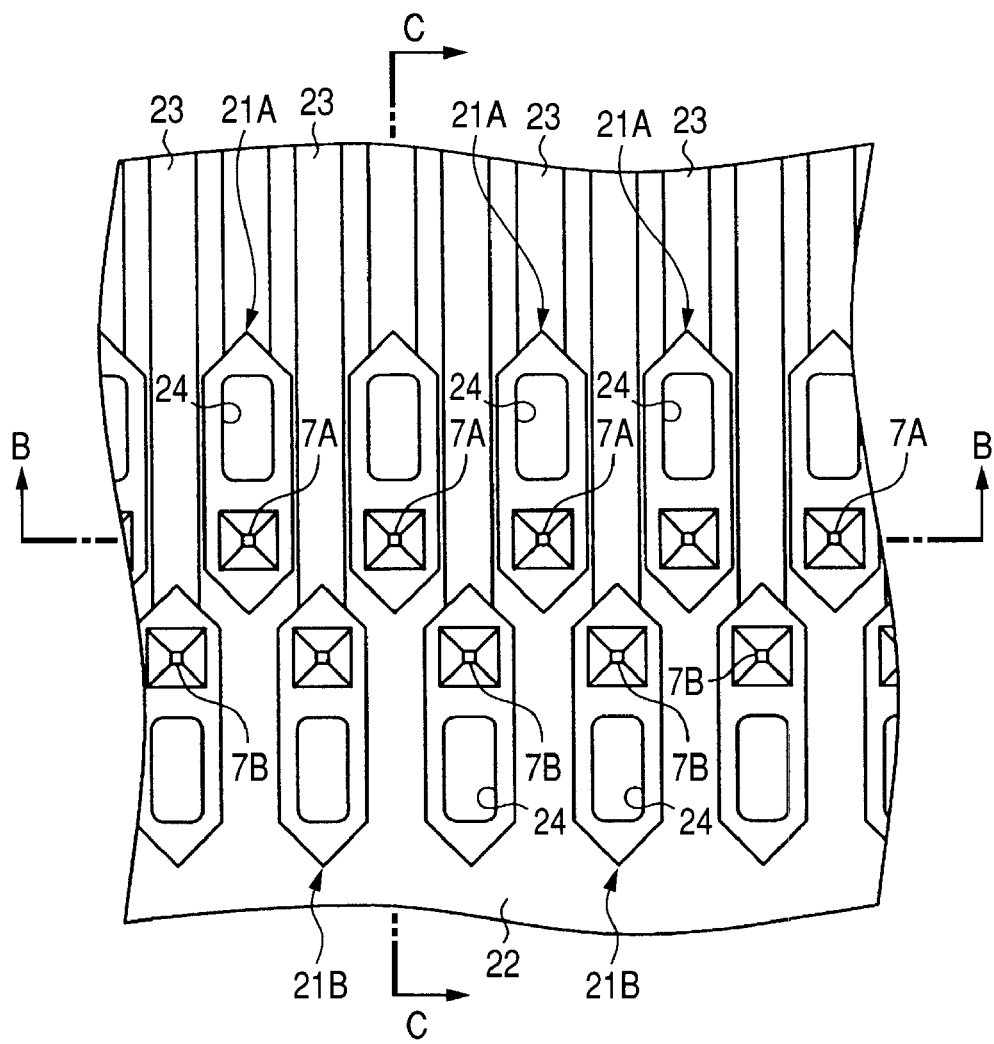
FIG. 7 is a plane view of an essential portion of a thin film sheet forming a probe card according to Embodiment 1 of the invention.
Figure 8:
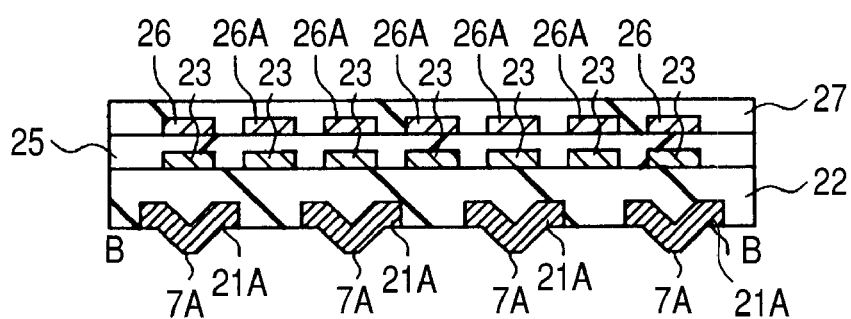
FIG. 8 is a sectional view taken along a line B-B of FIG. 7.
Figure 9:
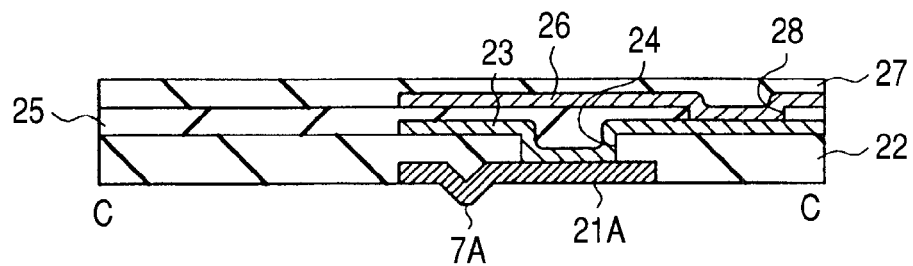
FIG. 9 is a sectional view taken along a line C-C of FIG. 7.

FIG. 7 is a plane view of an essential portion enlarging to show a portion of a region of the lower face of the thin film sheet 2 formed with the probe 7, FIG. 8 is a sectional view of an essential portion taken along a line B-B of FIG. 7, FIG. 9 is a sectional view of an essential portion taken along a line C-C of FIG. 7.

The probe 7 is a portion of a metal film 21A, 21B patterned in the thin film sheet 2 in a hexagonal shape in a plane view thereof, and is a portion jumped out in a shape of a quadrangular pyramid or a shape of a frustrum of a quadrangular pyramid at the lower face of the thin film 2 in the metal film 21A, 21B. The probe 7 is arranged at the position of the main face of the thin film 2 corresponding to the position of the pad 11 formed in the chip 10. In the probes 7, a probe 7A corresponds to the pad 11 of an alignment (hereinafter, described as first row) proximate to the outer periphery of the chip 10 relatively in the pads 11 aligned in two rows, a probe 7B corresponds to the pad 11 in an alignment (hereinafter, described as second row) remote from the outer periphery of the chip 10 relatively in the pads 11 in two rows.

The metal film 21A, 21B is formed by successively laminating a rhodium film and a nickel film from a lower layer thereof. A polyimide film 22 is formed on the metal film 21A, 21B, a wiring (second wiring) 23 for being electrically connected to each metal film 21 is formed on the polyimide film 22. The wiring 23 is brought into contact with the metal film 21A, 21B at a bottom portion of a through hole 24 formed at the polyimide film 22. Further, a polyimide film 25 is formed on the polyimide film 22 and the wiring 23, and the wiring 26, 26A is formed above the polyimide film 22. A polyimide film 27 is formed above the polyimide film 25 and the wiring 26, 26A. The wiring (second wiring) 26 extended above the metal film 21A is brought into contact with the wiring 23 at a bottom portion of a through hole 28 formed at the polyimide film 25 to be electrically connected the metal film 21A.

As described above, a portion of the metal film 21A, 21B becomes the probe 7A, 7B formed in the shape of the quadrangular pyramid or the shape of the fulcrum of quadrangular pyramid, and the polyimide film 22 is formed with the through hole 24 reaching the metal film 21A, 21B. Therefore, when a plane pattern of the metal film 21A formed with the probe 7A and the through hole 24, and a plane pattern of the metal film 21B formed with the probe 7B and the through hole 24 are made to be arranged in the same direction, the metal film 21A and the metal film 21B contiguous to each other are brought into contact with each other and there is a concern of a drawback that inputs/outputs respectively independent from each other are not provided from the probes 7A, 7B. Hence, in Embodiment 1, as shown by FIG. 7, the plane pattern of the metal film 21B formed with the probe 7B and the through hole 24 is constituted by a pattern constituted by rotating the plane pattern of the metal film 21A formed with the probe 7A and the through hole 24 by 180°. Thereby, a region having a wide width of the metal film 21A arranged with the probe 7A and the through hole 24 in a plane view thereof and a region having a wide width of the metal film 21B arranged with the probe 7B and the through hole 24 in a plane view thereof are not arranged on a straight line in a left and right direction of paper face, but regions of the metal film 21A and the metal film 21B in a taper shape in a plane view thereof are arranged on a straight line in the left and right direction of paper face. As a result, there is prevented a drawback that the metal film 21A and the metal film 21B contiguous to each other is brought into contact with each other. Further, even when the pads 11 (refer to FIG. 6) are arranged by a narrow pitch, the probes 7A, 7B can be arranged at positions in correspondence therewith.

Figure 10:
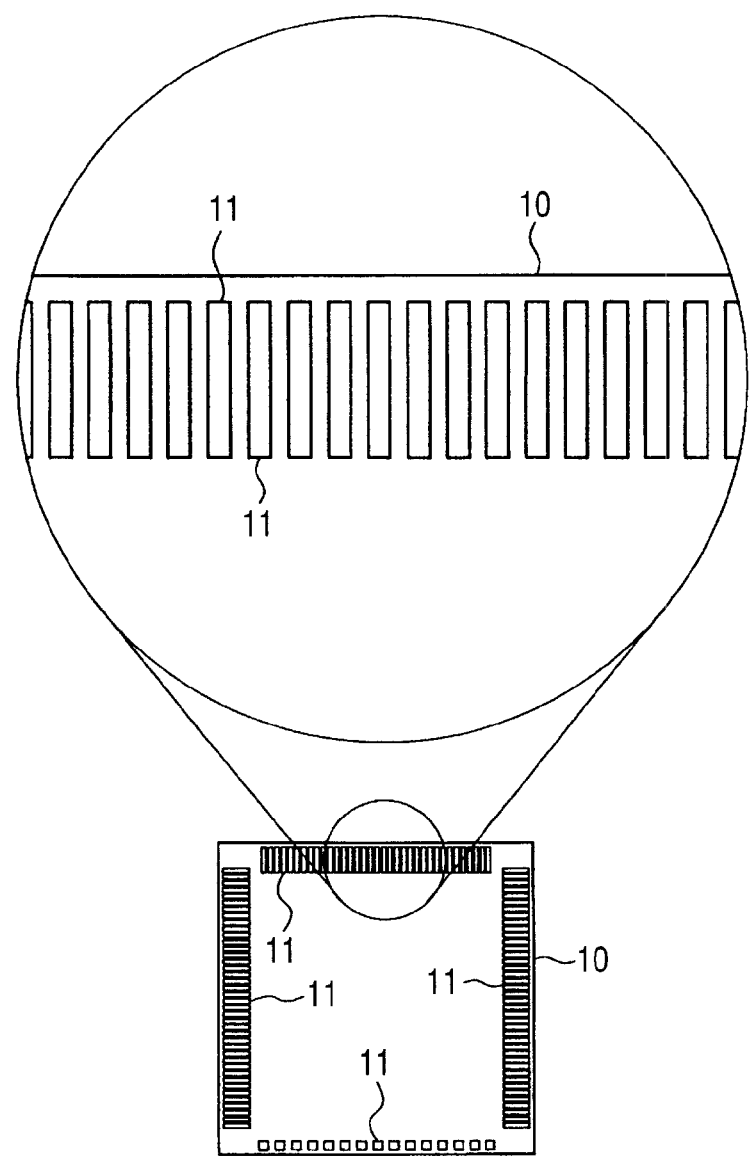
FIG. 10 is a plane view of a semiconductor chip constituting an object of carrying out probe testing by using a probe card according to Embodiment 1 of the invention.
Figure 11:
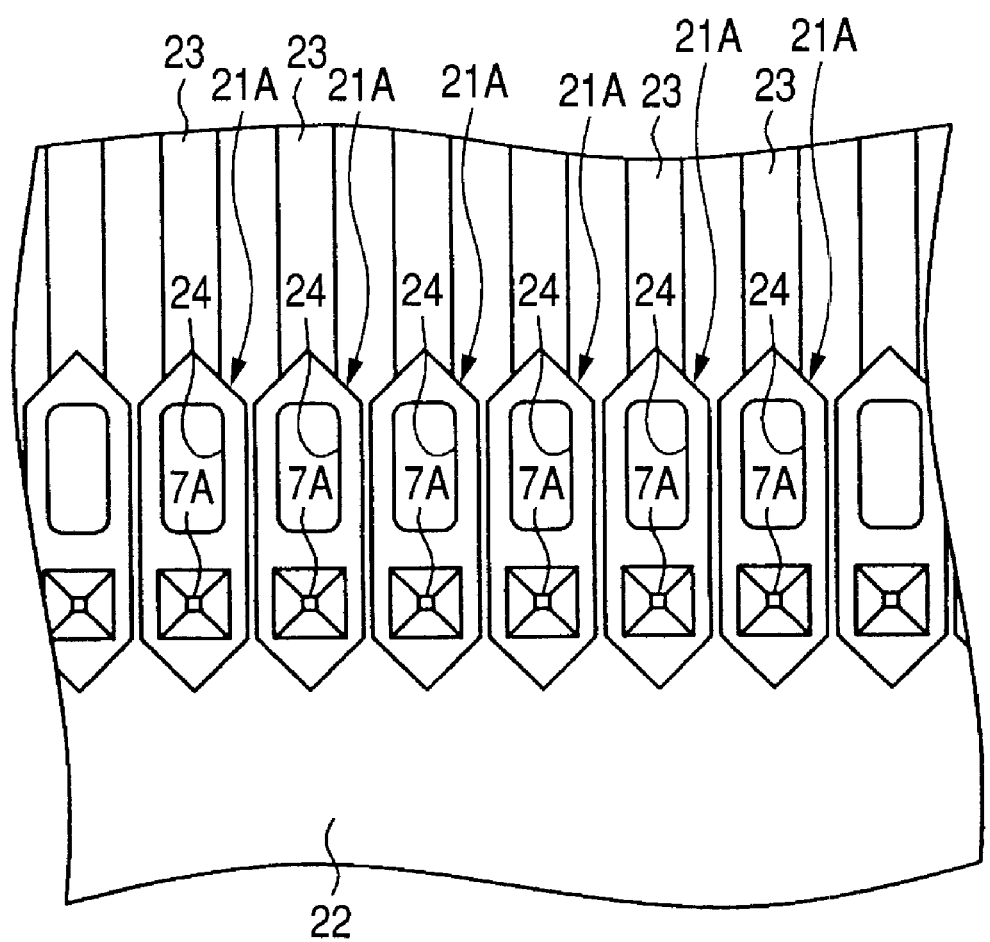
FIG. 11 is a plane view of an essential portion of a thin film sheet forming a probe card according to Embodiment 1 of the invention.
Figure 12:
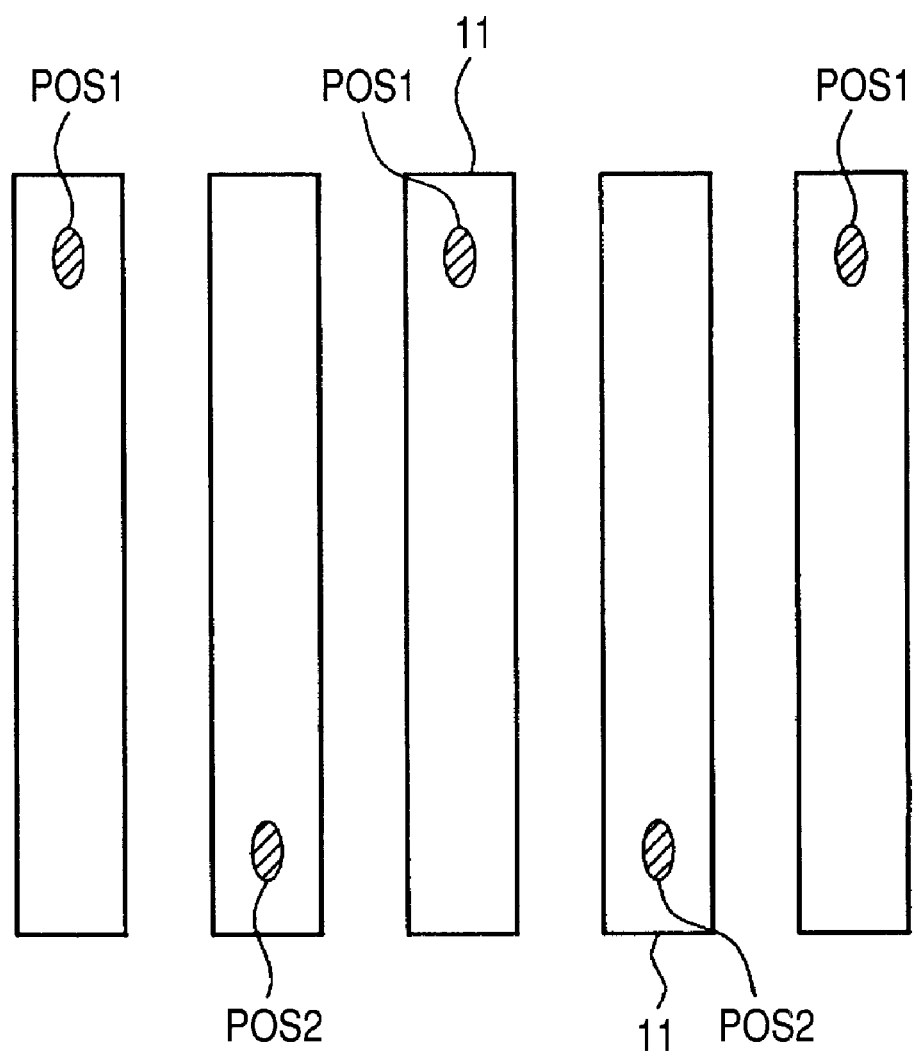
FIG. 12 is a plane view of an essential portion showing a position for bringing a probe into contact with a pad provided at a semiconductor chip constituting an object of carrying out probe testing by using a probe card according to Embodiment 1 of the invention.

Although according to the embodiment, an explanation has been given of a case of aligning the pads 11 in two rows in reference to FIG. 6, there are also present chips aligned in one row as shown by FIG. 10. Such a chip can be dealt with by using the thin film sheet 2 aligned with the regions of the metal films 21A having the wide width on a straight line in the left and right direction of paper face as shown by FIG. 11. Further, in a case in which the pads 11 are aligned in one row in this way, the pad 11 is small so as not to be able to be dealt with by the thin film sheet 2 having the metal films 21A on the pattern shown in FIG. 11, and the pitch of arranging the pads is narrow, the case can be dealt with as follows. That is, by using the thin film sheet 2 having the metal films 21A of the pattern shown in FIG. 7 through FIG. 9, a position of a center of the pad 11 in a direction along the outer periphery of the chip 10 can be aligned with a position of a center of the pad 11 shown in FIG. 6, each of the probes 7A, 7B can be brought into contact with the pads 11 at positions POS1, POS2 shown in FIG. 12.

Figure 13:
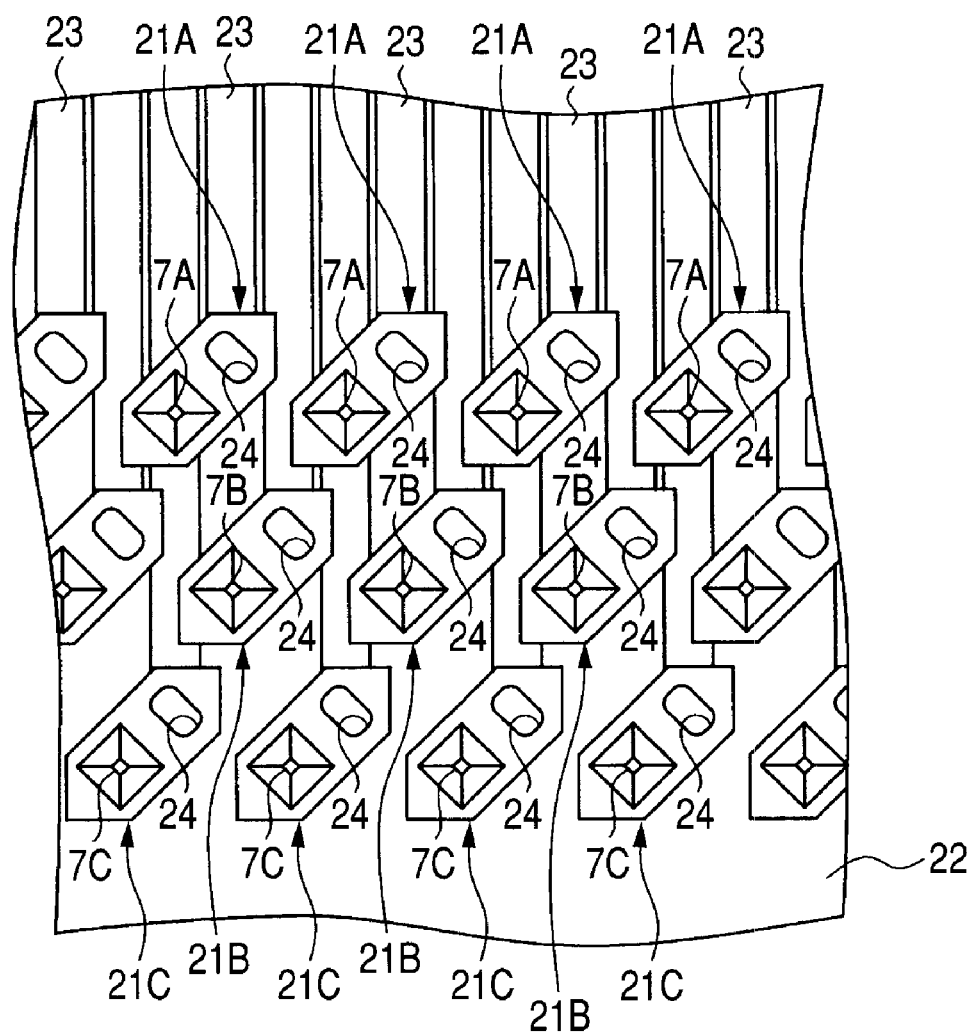
FIG. 13 is a plane view of an essential portion of a thin film sheet forming a probe card according to Embodiment 1 of the invention.
Figure 14:
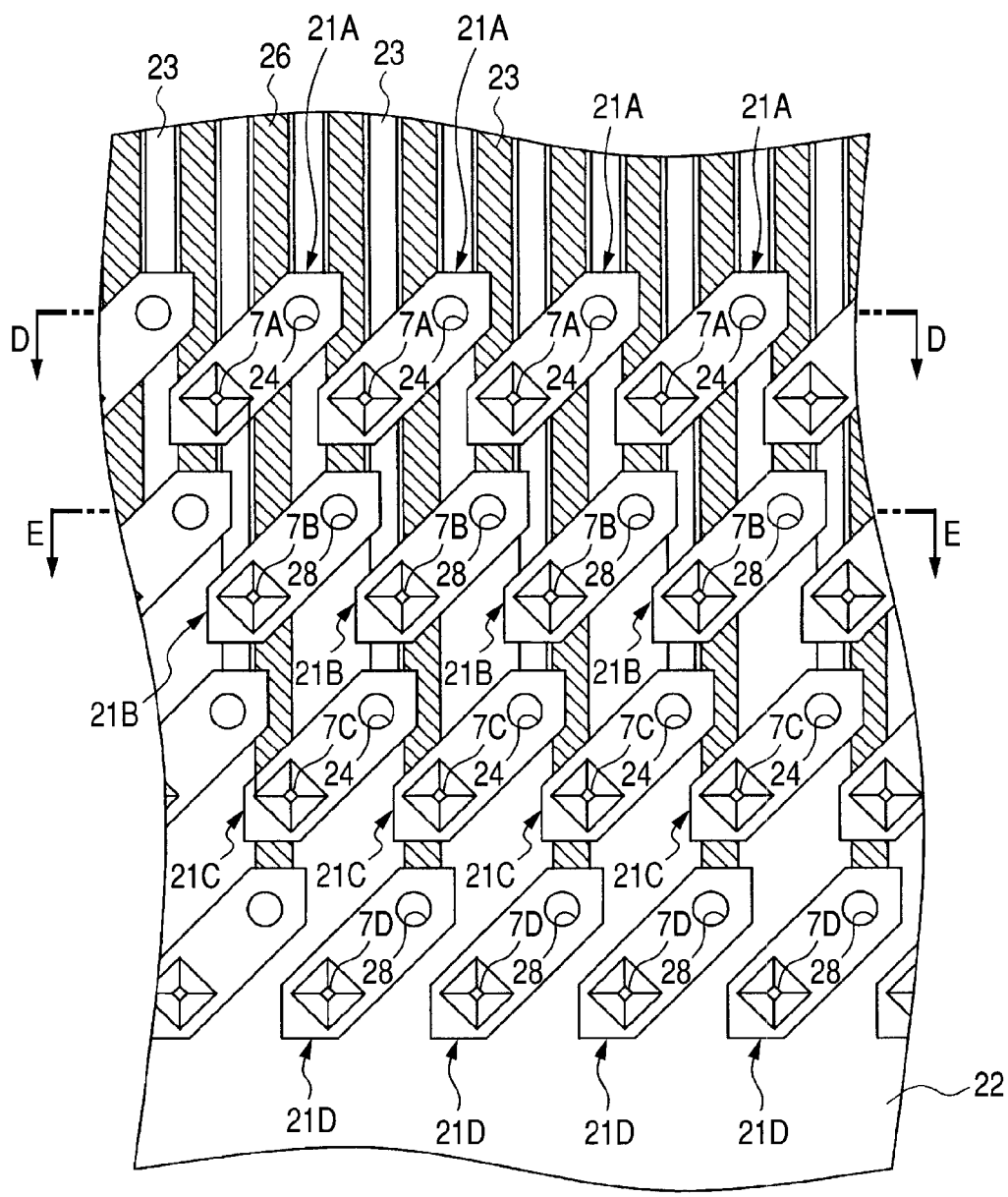
FIG. 14 is a plane view of an essential portion of a thin film sheet forming a probe card according to Embodiment 1 of the invention.

Further, when the number of the pads 11 is larger, there is also a case of aligning the pads 11 by three or more rows. FIG. 13 is a plane view of an essential portion of the thin film sheet 2 in correspondence with the pads 11 aligned in three rows, FIG. 14 is a plane view of an essential portion of the thin film sheet 2 in correspondence with the pads 11 aligned in four rows. When a size of the chip 10 stays the same, in accordance with an increase in a number of aligning the pads 11, the interval between the metal films 21A, 21B contiguous to each other becomes narrower and therefore, there is a further concern that metal films including the metal films 21A, 21B are brought into contact with each other. Hence, as shown by FIG. 13 and FIG. 14, by constituting metal films 21A, 21B, 21C, 21D by rotating, for example, a plane pattern of the metal film 21A shown in FIG. 7 by 45°, the drawback that the metal films 21A, 21B, 21C, 21D are brought into contact with each other can be prevented. Further, although an explanation has been given of an example of rotating the plane pattern of the metal film 21A shown in FIG. 7 by 45°, the invention is not limited to 45° but other rotational angle will do so far as the metal films 21A, 21B, 21C, 21D can be prevented from being brought into contact with each other. Further, the metal film 21C is formed with a probe 7C in correspondence with the pad 11 arranged on an inner side from the pad 11 in correspondence with the probe 7B at inside of the chip 10, the metal film 21D is formed with a probe 7D in correspondence with the pad 11 arranged on an inner side from the pad 11 in correspondence with the probe 7C at inside of the chip 10.

Figure 15:
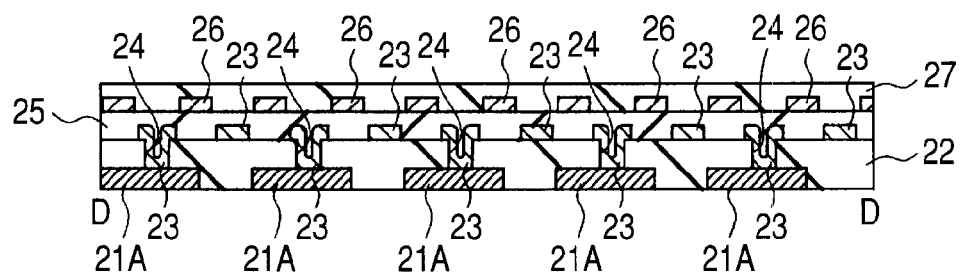
FIG. 15 is a sectional view taken along a line D-D of FIG. 14.
Figure 16:
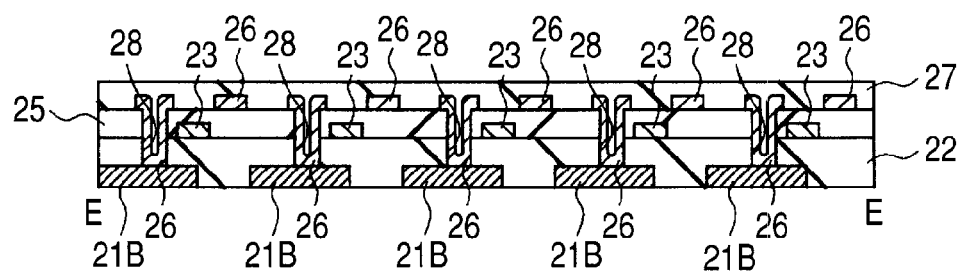
FIG. 16 is a sectional view taken along a line E-E of FIG. 14.

Here, FIG. 15 is a sectional view of an essential portion taken along a line D-D of FIG. 14, FIG. 16 is a sectional view of an essential portion taken along a line E-E of FIG. 14. As shown by FIG. 14, when the metal films 21A through 21D having the probes 7A through 7D in correspondence with the pads 11 of four rows are arranged, it is difficult to form all of wirings electrically connected to each of the metal films 21A through 21D, from an upper layer by the same wiring layer. This is because by narrowing the intervals between the metal films 21A through 21D contiguous to each other, there is brought about a concern of bringing each of the metal films 21A through 21D into contact with each other and there is brought about a concern of bringing also wirings electrically connected to the metal films 21A through 21D into contact with each other. Hence, according to Embodiment 1, as shown by FIG. 15 and FIG. 16, it can be exemplified to form the wirings by two layers of wiring layers (wirings 23, 26). Further, the polyimide film 27 is formed above the wiring 26 and the polyimide film 25. The wiring 23 at the relatively low layer is brought into contact with the metal films 21A, 21C at the bottom portion of the through hole 24 formed at the polyimide film 22, the wiring 26 at the relatively upper layer is brought into contact with the metal film 21B, 21D at the bottom portion of the through hole 28 formed at the polyimide film 22, 25. Thereby, in the same wiring layer, the interval between the wirings 23 or the wirings 26 contiguous to each other can be ensured to be large and therefore, the drawback that the wirings 23 or the wirings 26 contiguous to each other are brought into contact with each other can be prevented. Further, when the pads 11 are constituted by five or more rows, the number of probes in correspondence therewith is increased and the intervals of the metal films 21A through 21D contiguous to each other are narrowed, the wiring interval may be widened by forming wiring layers by more layers.

Next, an explanation will be given of a structure of the thin film sheet 2 according to Embodiment 1 as well as manufacturing steps thereof in reference to FIG. 17 through FIG. 29. FIG. 17 through FIG. 29 are sectional views of essential portions or plane views of essential portions in steps of manufacturing the thin film sheet 2 having the probes 7A, 7B in correspondence with two rows of the pads 11 (refer to FIG. 6) explained in reference to FIG. 7 through FIG. 9. Further, the structure of the thin film sheet and the steps of manufacturing the thin film sheet, a structure and manufacturing steps of a probe similar to the probe 7 (probes 7A through 7D) are described also in Japanese Patent Application Laid-open Nos. 2004-288672, 2005-136246 and 2005-136302, Japanese Patent Application No. 2004-115048, International Application No. PCT/JP2004/17160, International Application No. PCT/JP2005/4344, Japanese Patent Application No. 2005-109350, Japanese Patent Application No. 2005-168112, Japanese Patent Application No. 2005-181085, Japanese Patent Application No. 2005-194561, Japanese Patent Application No. 2005-291886 and Japanese Patent Application No. 2005-315115.

Figure 17:
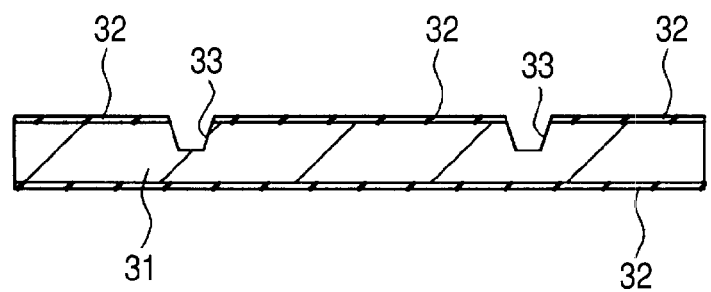
FIG. 17 is a sectional view of an essential portion for explaining a step of manufacturing a thin film sheet forming a probe card according to Embodiment 1 of the invention.

First, as shown by FIG. 17, a wafer 31 comprising silicon having a thickness of about 0.2 mm through 0.6 mm is prepared, and both faces of the wafer 31 are formed with silicon oxide films 32 having a film thickness of about 0.5 µm by a thermal oxidation method. Successively, the silicon oxide film 32 on a main face side of the wafer 31 is etched by constituting a mask by a photoresist film to form an opening portion reaching the wafer 31 at the silicon oxide film 32 on the main face side of the wafer 31. Next, the main face of the wafer 31 is formed with a hole 33 in a shape of a quadrangular pyramid or a shape of a frustrum of a quadrangular pyramid surrounded by (111) face by anisotropically etching the wafer 31 by constituting a mask by a remaining silicon oxide film 32 and using an aqueous solution of strong alkali (for example, an aqueous solution of potassium hydroxide).

Figure 18:
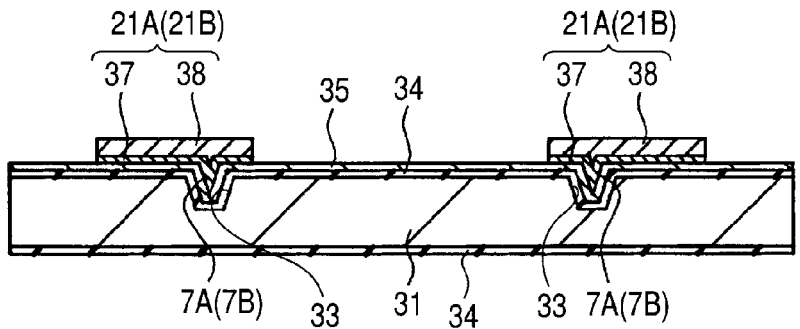
FIG. 18 is a sectional view of an essential portion in a step of manufacturing a thin film sheet continuous to FIG. 17.
Figure 19:
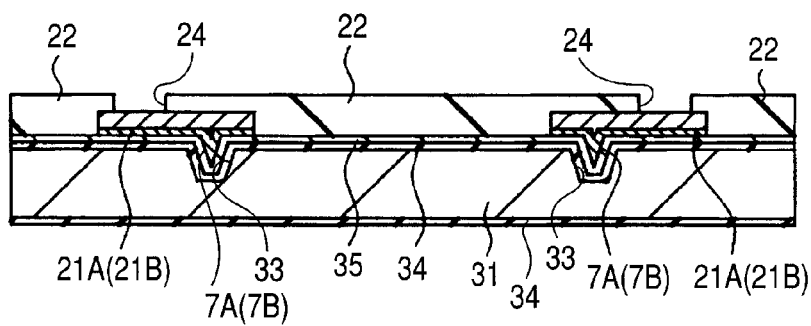
FIG. 19 is a sectional view of an essential portion in a step of manufacturing a thin film sheet continuous to FIG. 18.

Next, as shown by FIG. 18, the silicon oxide film 32 used as the mask in forming the hole 33 is removed by wet etching by a mixture solution of hydrofluoric acid and ammonium fluoride. Next, a silicon oxide film 34 having a film thickness of about 0.5 µm is formed on an entire face of the wafer 31 including inside of the hole 33 by subjecting the wafer 31 to a thermal oxidation treatment. Next, a conductive film 35 is formed at the main face of the wafer 31 including inside of the hole 33. The conductive film 35 can be formed by depositing, for example, a chromium film having a film thickness of about 0.1 µm and a copper film having a film thickness of about 1 µm successively by a sputtering method or a vapor deposition method. Next, a photoresist film is formed on the conductive film 35, the photoresist film in a region to be formed with the metal films 21A, 21B (refer to FIG. 9 through FIG. 11) at later steps by a photolithography technique is removed and an opening portion is formed.

Next, a conductive film 37 and a conductive film 38 having a high hardness are successively deposited on the conductive film 35 emerged at a bottom portion of the opening portion of the photoresist film by an electrolytic plating method constituting an electrode by the conductive film 35. In Embodiment 1, it can be exemplified to constitute the conductive film 37 by a rhodium film and constitute the conductive film 38 by a nickel film. The above-described metal films 21A, 21B can be formed from the conductive films 37, 38 by the step up to here. Further, the conductive films 37, 38 at inside of the holes 33 constitute the above-described probes 7A, 7B. Further, although the conductive film 35 is removed at a later step, the step will be described later.

In the metal films 21A, 21B, when formed with the probes 7A, 7B at later step, the conductive film 37 formed by the rhodium film constitutes a surface, and the conductive film 37 is brought into direct contact with the pad 11. Therefore, as the conductive film 37, it is preferable to select a material having a high hardness and excellent in wear resistance. Further, since the conductive film 37 is brought into direct contact with the pad 11, when a chip of the pad 11 ground by the probe 7A, 7B is adhered to the conductive film 37, a cleaning step of removing the chip is needed, and there is a concern of prolonging a probe testing step. Therefore, it is preferable to select a material of the conductive film 37 which is difficult to be adhered with the material for forming the pad 11. Hence, according to Embodiment 1, as the conductive film 37, the rhodium film satisfying the conditions is selected. Thereby, the cleaning step can be omitted.

Figure 21:
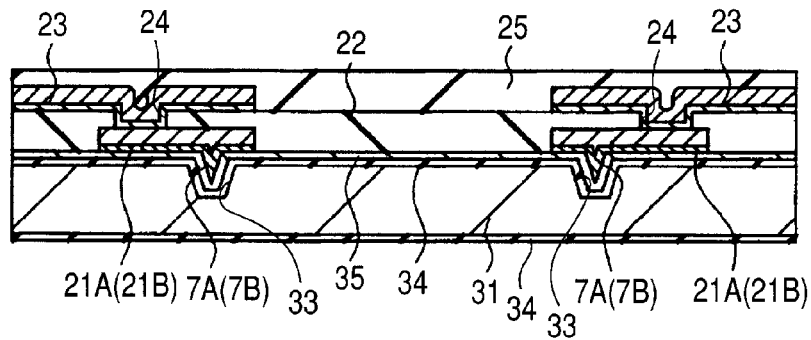
FIG. 21 is a sectional view of an essential portion in a step of manufacturing a thin film sheet continuous to FIG. 20.

Next, after removing the photoresist film used in forming the metal films 21A, 21B (conductive films 37, 38), as shown by FIG. 21, the polyimide film 22 (also refer to FIG. 8 and FIG. 9) is formed to cover the metal films 21A, 21B and the conductive film 35. Successively, the polyimide film 22 is formed with the through holes 24 reaching the metal films 21A, 21B. The through hole 24 can be formed by boring using laser or dry etching constituting a mask by an aluminum film.

Figure 20:
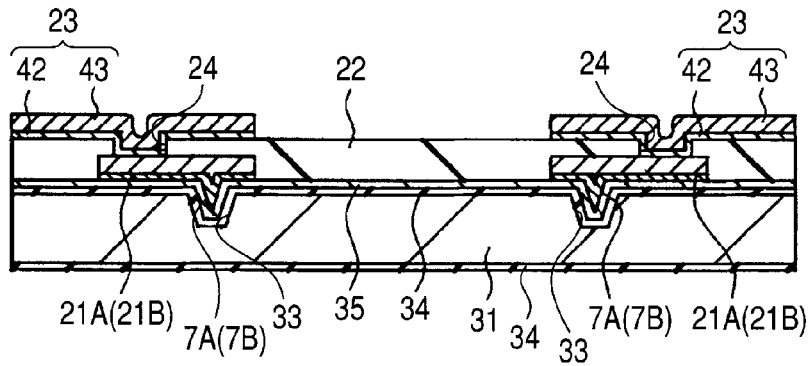
FIG. 20 is a sectional view of an essential portion in a step of manufacturing a thin film sheet continuous to FIG. 19.

Next, as shown by FIG. 20, a conductive film 42 is formed on the polyimide film 22 including inside of the through hole 24. The conductive film 42 can be formed by depositing, for example, a chromium film having a film thickness of about 0.1 µm and a copper film having a film thickness of about 1 µm successively by a sputtering method or a vapor deposition method. Successively, after forming a photoresist film on the conductive film 42, the photoresist film is patterned by a photolithography technique to form an opening portion reaching the conductive film 42. Next, a conductive film 43 is formed on the conductive film 42 at inside of the opening portion by a plating method. In Embodiment 1, there can be exemplified a laminated film constituted by successively depositing a copper film, or the copper film and a nickel film from a lower layer as the conductive film 43.

Next, after removing the photoresist film, the wiring 23 comprising the conductive films 42, 43 are formed by etching the conductive film 42 by constituting a mask by the conductive film 43. The wiring 23 can electrically be connected to the metal films 21A, 21B at a bottom portion of the through hole 24.

Further, at step of forming the wiring 23, also a wiring which is not electrically connected to the metal films 21A, 21B is formed at a wiring layer the same as that of the wiring 23. Also the wiring can be formed from the conductive films 42, 43 similar to the wiring 23.

Figure 22:
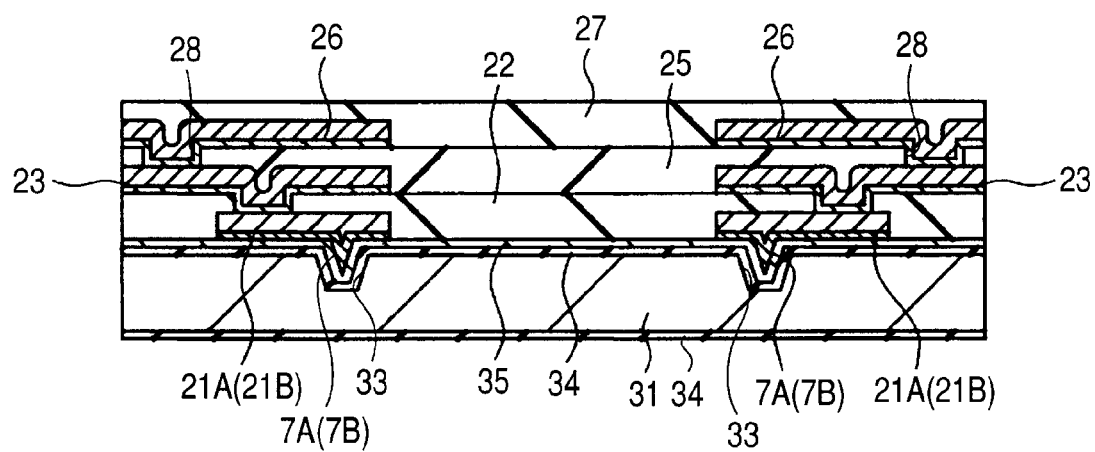
FIG. 22 is a sectional view of an essential portion in a step of manufacturing a thin film sheet continuous to FIG. 21.

Next, as shown by FIG. 21, the polyimide film 25 is formed at the main face of the wafer 31. Successively, as shown by FIG. 22, the through hole 28, the wiring 26 and the polyimide film 27 are formed by repeating steps similar to steps of forming the through hole 24, the wiring 23 and the polyimide film 25. The wiring 26 can electrically be connected to the wiring 23 at a bottom portion of the through hole 28. Further, in forming the wiring 26, the wiring 26A (refer to FIG. 8) is also formed at a wiring layer the same as that of the wiring 26.

Figure 23:
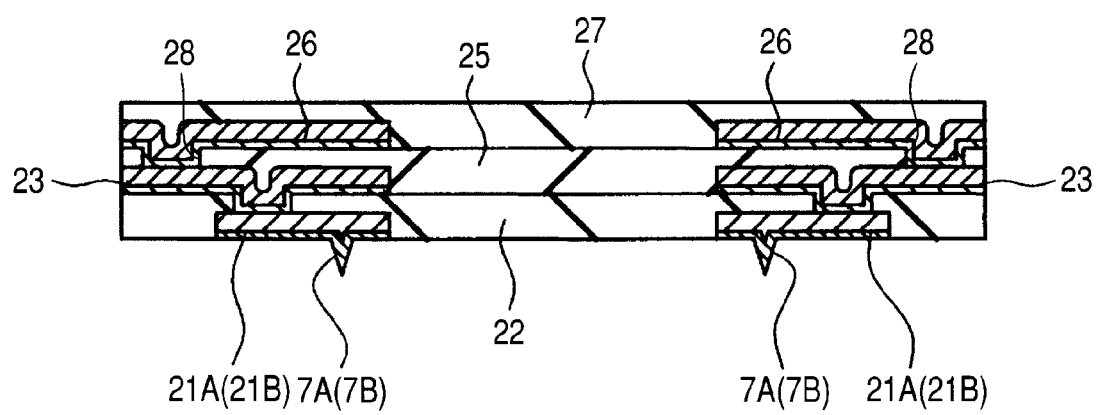
FIG. 23 is a sectional view of an essential portion in a step of manufacturing a thin film sheet continuous to FIG. 22.
Figure 24:
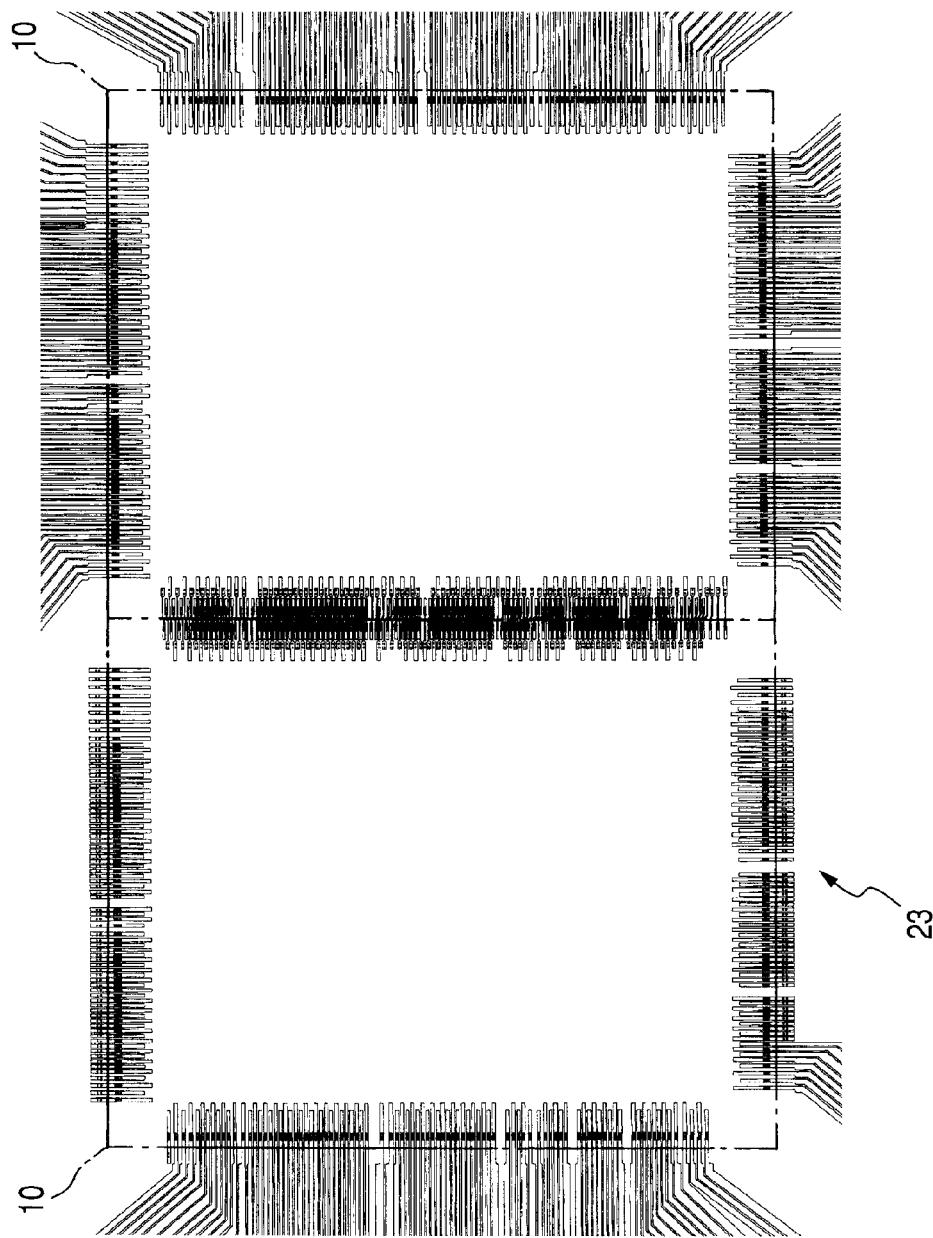
FIG. 24 is a plane view of an essential portion of a thin film sheet forming a probe card according to Embodiment 1 of the invention.
Figure 25:
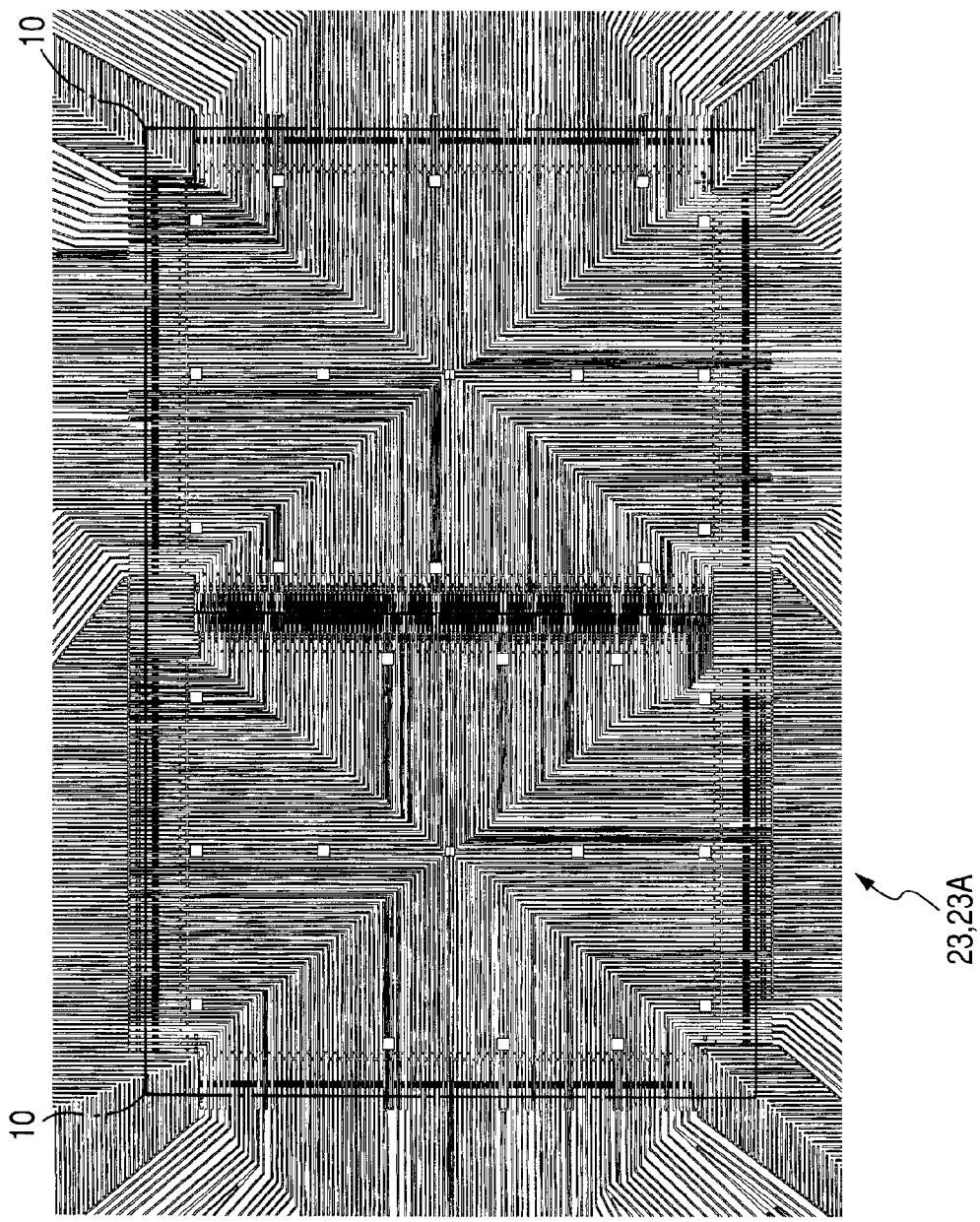
FIG. 25 is a plane view of an essential portion of a thin film sheet forming a probe card according to Embodiment 1 of the invention.
Figure 26:
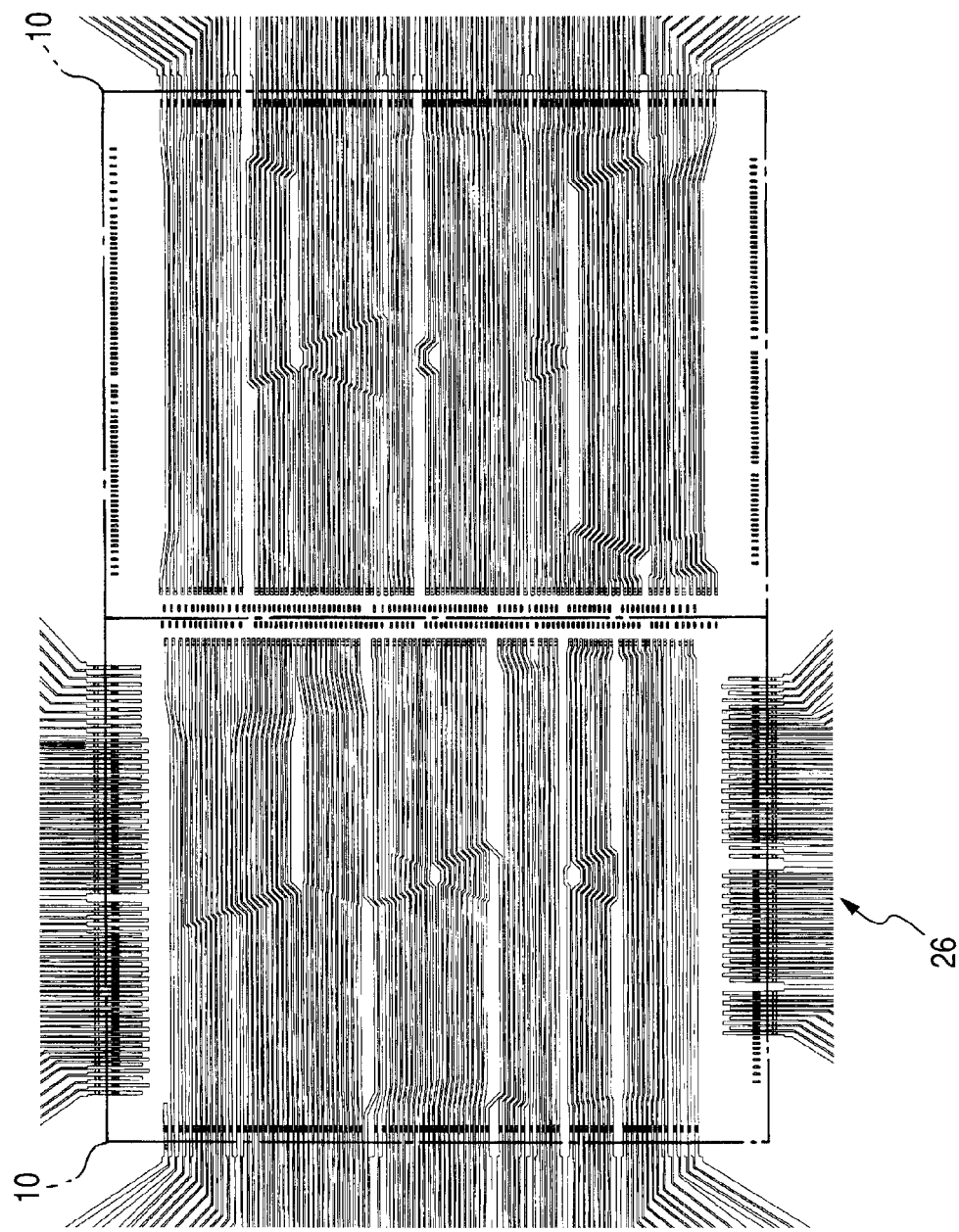
FIG. 26 is a plane view of an essential portion of a thin film sheet forming a probe card according to Embodiment 1 of the invention.
Figure 27:
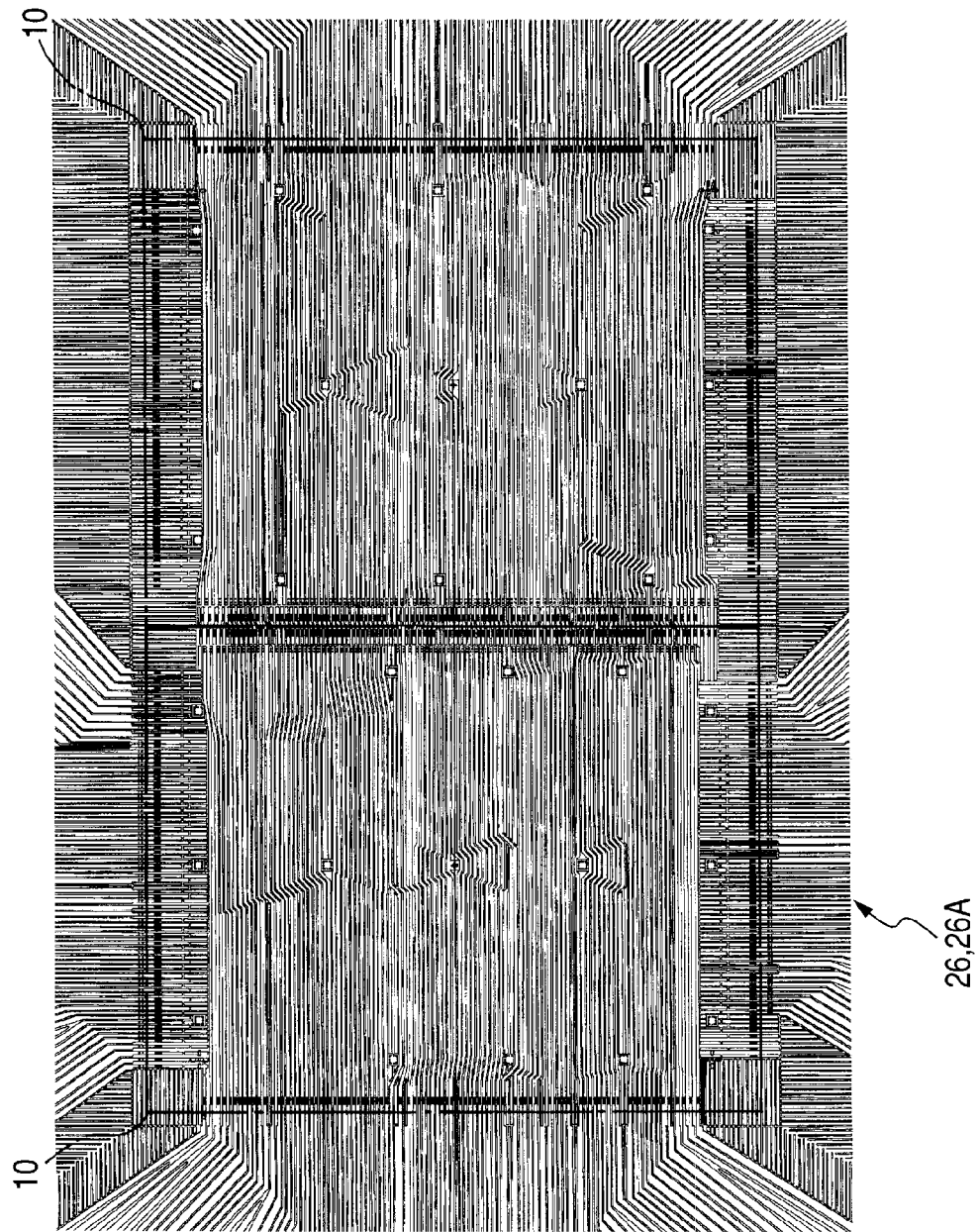
FIG. 27 is a plane view of an essential portion of a thin film sheet forming a probe card according to Embodiment 1 of the invention.

Next, as shown by FIG. 23, the silicon oxide film 34 at a back face of the wafer 31 is removed by etching using, for example, a mixture solution of hydrofluoric acid and ammonium fluoride. Successively, the wafer 31 constituting a base member for forming the thin film sheet 2 is removed by etching by using an aqueous solution of strong alkali (for example, an aqueous solution of potassium hydroxide). Next, the silicon oxide film 34 and the conductive film 35 are removed successively by etching to fabricate the thin film sheet 2 of Embodiment 1. At this occasion, the silicon oxide film 34 is etched by using a mixture solution of hydrofluoric acid and ammonium fluoride, the chromium film included in the conductive film 35 is etched by using an aqueous solution of potassium permanganate, the copper film included in the conductive film 35 is etched by using an alkaline copper etching solution. By steps up to here, the rhodium film constituting the conductive film 37 (refer to FIG. 18) forming the probes 7A, 7B emerges at the surfaces of the probes 7A, 7B. As described above, according to the probes 7A, 7B formed with the rhodium films at surfaces thereof, Au or the like constituting a material of the pad 11 with which the probes 7A, 7B are brought into contact is difficult to adhere thereto. A hardness thereof is high by Ni, and the probes are difficult to be oxidized, and a contact resistance can be stabilized.

The wiring may further be formed in multilayers by repeating the steps of forming the through hole 24, the wiring 23 and the polyimide film 25 as necessary.

In Embodiment 1, the probe testing is carried out for two adjacent pieces of the chips 10 which are opposed to each other at one side thereof in one motion. Here, FIG. 24 through FIG. 27 are plane views of essential portions showing a region in correspondence with two pieces of the chip 10 constituting the testing object in the thin film sheet 2, and regions in the drawings surrounded by a one-dotted chain lines correspond to an outer shape of the chip 10. Further, FIG. 24 through FIG. 27 respectively illustrate a plane pattern of the wiring 23 formed at the wiring layer of a first layer, a plane pattern constituted by adding the wiring 23A formed at the wiring layer the same as that of the wiring 23 to the plane pattern of FIG. 24, a plane pattern of the wiring 26 formed at the wiring layer of a second layer, and a plane pattern constituted by adding the wiring (third wiring) 26A formed at the wiring layer the same as that of the wiring 26 to the plane pattern of FIG. 26. The wiring (third wiring) 23A is a wiring which is not electrically connected to the metal films 21A, 21B described above in reference to FIG. 21.

The plane patterns shown in FIG. 24 through FIG. 27 is for a case in which there is a restriction in allocating channels in the probe card of Embodiment 1, in order to electrically connecting the respective wirings 23, 26 to a predetermined channel, the respective wirings 23, 26 need to be electrically connected to a predetermined one of the POGO sheet 8 (refer to FIG. 2).

A portion of the wiring 23 electrically connected to the metal films 21A, 21B is led around to an outer periphery of the thin film sheet 2, and is electrically connected to a corresponding one of plural receiving portions provided at the multilayer wiring substrate 1 (refer to FIG. 1 and FIG. 2). Further, the other wiring 23 is connected with the wiring 26, each wiring 26 is led around to the outer periphery of the thin film sheet 2, and is electrically connected to a corresponding one of the plural receiving portions provided at the multilayer wiring substrate 1.

Figure 28:
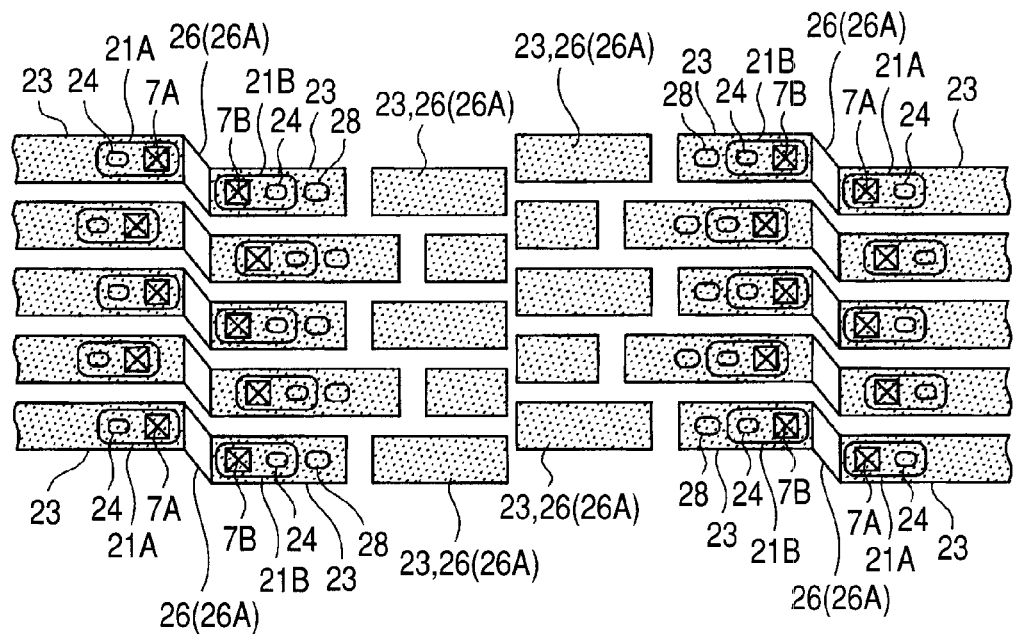
FIG. 28 is a plane view of an essential portion of a thin film sheet forming a probe card according to Embodiment 1 of the invention.

As shown by FIG. 28, in Embodiment 1, at regions constituting vicinities of the probes 7A, 7B in a plane view thereof, a plane pattern of respective wirings is formed such that the wiring 23 and the wiring 26 electrically connected to the wiring 23 or the wiring 26A which is not electrically connected to the wiring 23 overlap each other. Further, a portion in FIG. 28 attached with a hatching in a satin pattern indicates a portion at which the wiring 23 and the wiring 26 or the wiring 26A overlap each other, and indicates a portion at which the wiring 23 is arranged. Further, upper portions of the probes 7A, 7B are constituted by a plane pattern of arranging both of the wiring 23 and the wiring 26 (or, wiring 26A). By constituting such a plane pattern, a thickness of the thin film sheet 2 can be made to be uniform at respective upper portions of the probes 7A, 7B. Thereby, in the probe testing, a load applied from the press piece 9 (refer to FIG. 3) can be made to be applied uniformly to the respective probes 7A, 7B. As a result, a performance of bringing each of the probes 7A, 7B and the corresponding pads 11 (refer to FIG. 6 and FIG. 10) into contact with each other can be promoted.

Figure 29:
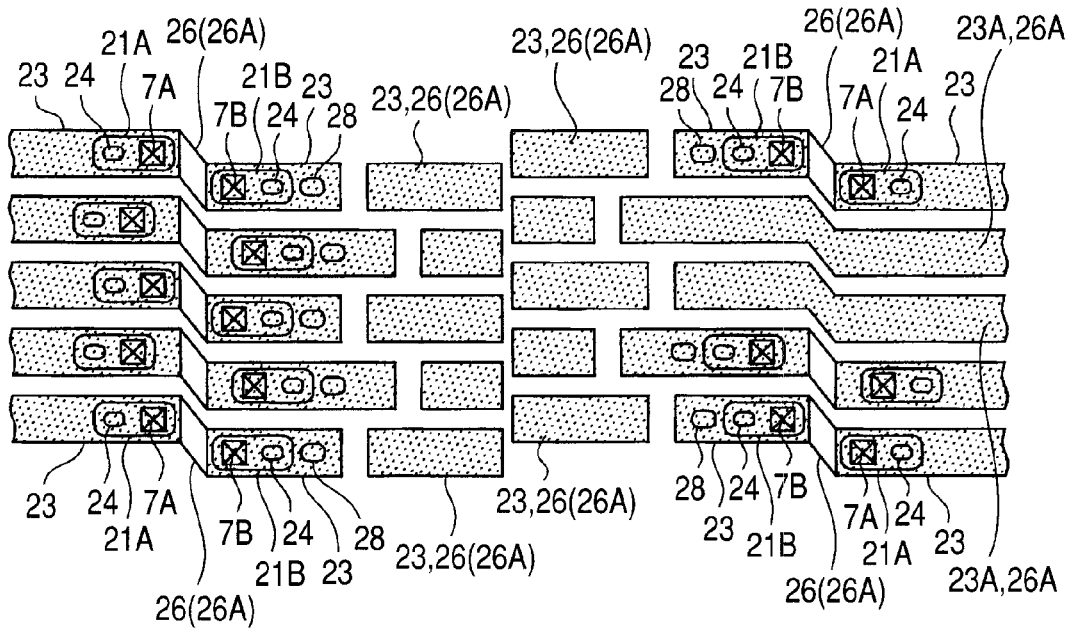
FIG. 29 is a plane view of an essential portion of a thin film sheet forming a probe card according to Embodiment 1 of the invention.
Figure 30:
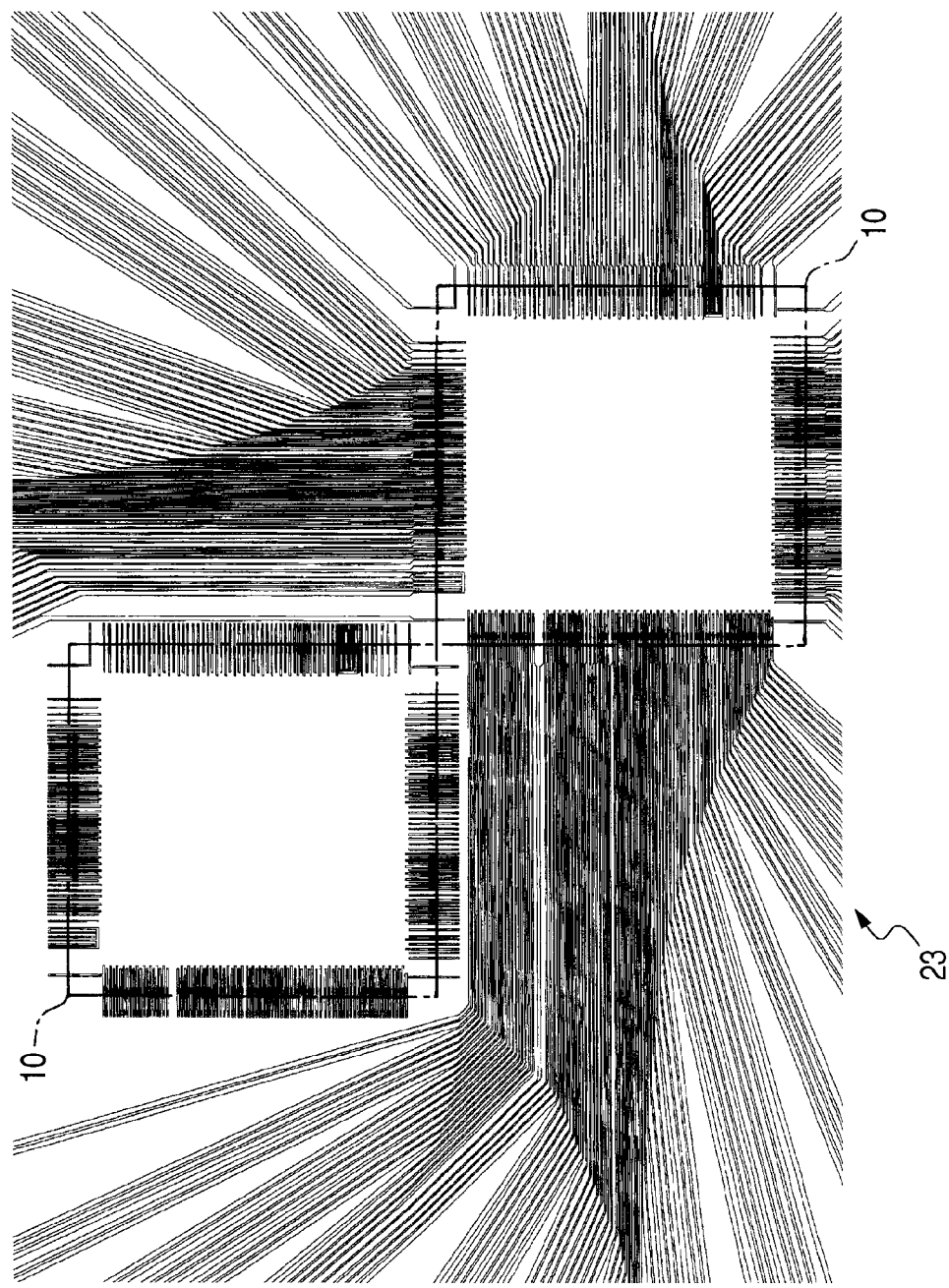
FIG. 30 is a plane view of an essential portion of a thin film sheet forming a probe card according to Embodiment 1 of the invention.
Figure 31:
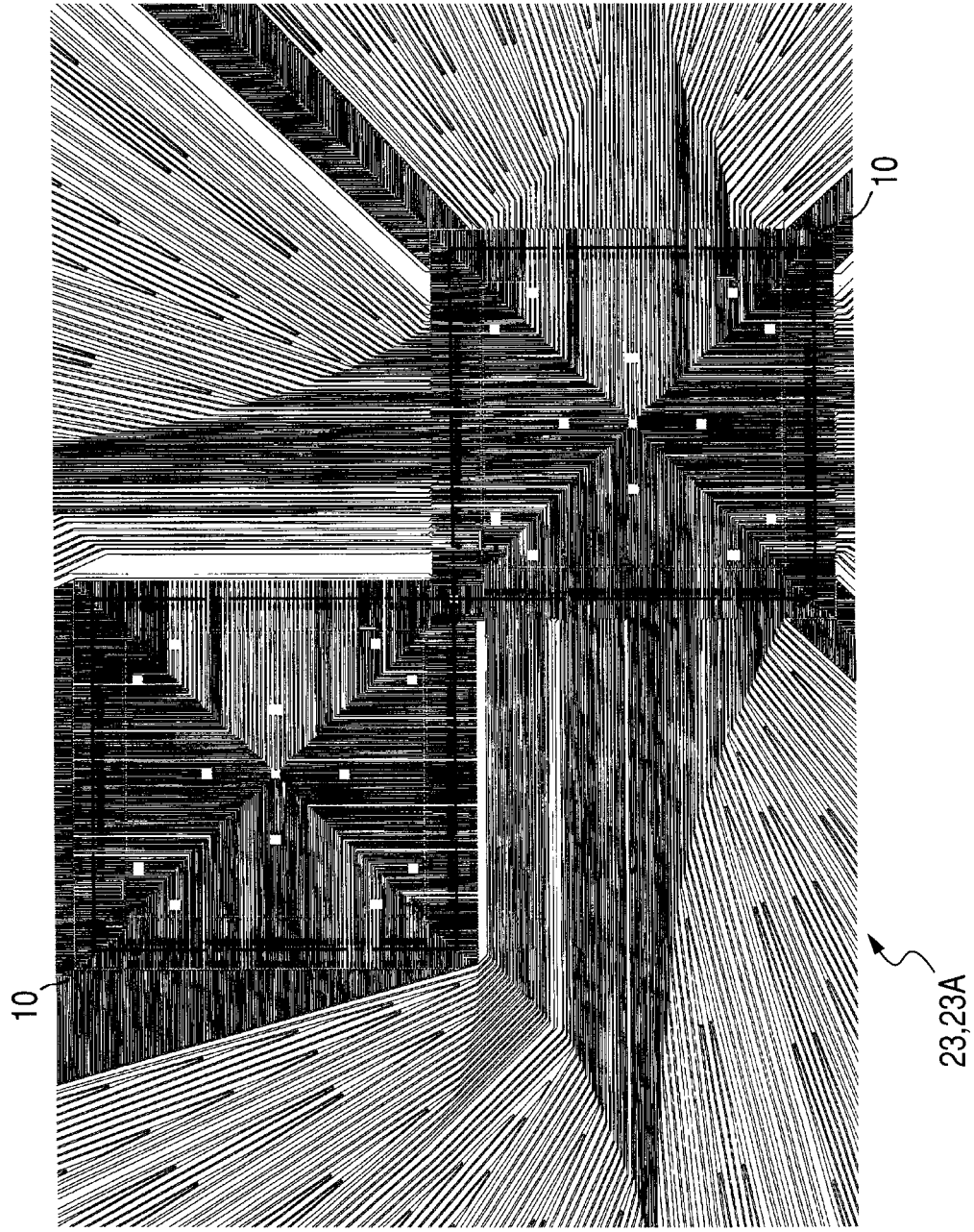
FIG. 31 is a plane view of an essential portion of a thin film sheet forming a probe card according to Embodiment 1 of the invention.
Figure 32:
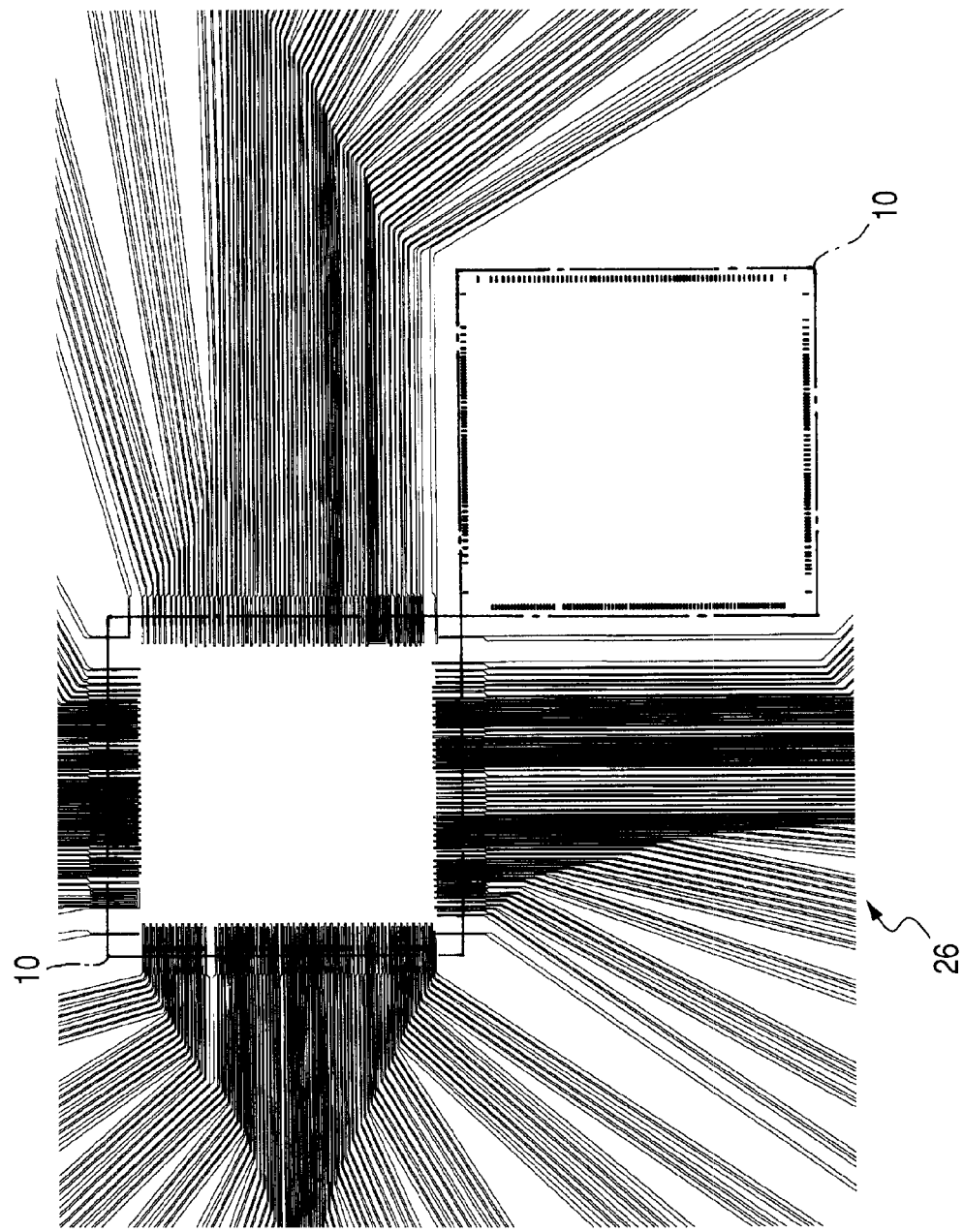
FIG. 32 is a plane view of an essential portion of a thin film sheet forming a probe card according to Embodiment 1 of the invention.
Figure 33:
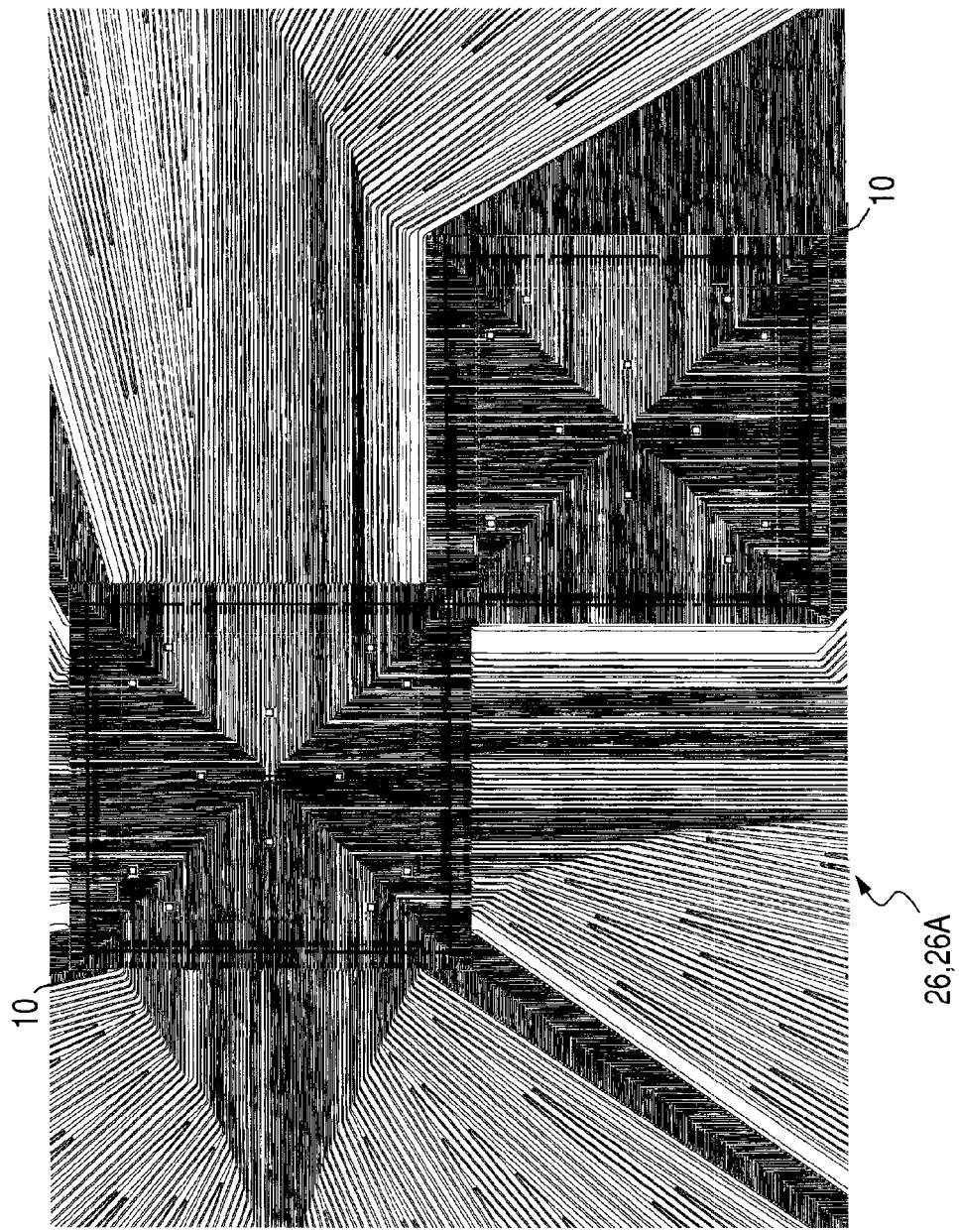
FIG. 33 is a plane view of an essential portion of a thin film sheet forming a probe card according to Embodiment 1 of the invention.

Further, in Embodiment 1, in the respective wiring layers in the thin film sheet 2, patterns of the wirings are formed such that intervals of arranging the wiring and densities of arranging the wirings become uniform. For example, as shown by FIG. 29, at a portion at which an interval of arranging the wirings 23 is excessively large in the wiring layer formed with the wiring 23, by arranging the wiring 23A which is not electrically connected to the metal films 21A, 21B, the interval of arranging the wirings and the density of arranging the wirings can be made to be uniform in the wiring layer. The wiring 23A can be formed simultaneously at step of forming the wiring 23. Further, the wiring 26A is arranged at the portion at which the interval of arranging the wirings 26 is excessively large in the wiring layer formed with the wirings 26, by arranging the wiring 26A, the interval of arranging the wirings and the density of arranging the wirings can be made to be uniform in the wiring layer. In this way, by forming the pattern of the wirings such that the interval of arranging the wirings and the density of arranging the wirings become uniform in the respective wiring layers in the thin film sheet 2, a rigidity and a thickness can be made to be uniform particularly in the vicinity of the probes 7A, 7B in the thin film sheet 2. Thereby, in the vicinity of the probes 7A, 7B, the thin film sheet 2 can be prevented from being wrinkled and bent and therefore, the performance of bringing each of the probes 7A, 7B and the corresponding pads 11 into contact with each other can be promoted.

Although in FIG. 24 through FIG. 27, there is shown the plane pattern of the wirings in the thin film sheet 2 when the probe testing is carried out in one motion for two adjacent pieces of the chip 10 which are opposed to each other at the one side, the plane pattern of the wirings of the respective wiring layers in the thin film sheet 2 may be formed such that the probe testing can be carried out in one motion for two pieces of the chip 10 contiguous in a diagonal line direction (diagonally). Here, FIG. 30 through FIG. 33 are plane views of essential portions showing a region in corresponding with two pieces of the chip 10 constituting the testing object in the thin film sheet 2, and regions in the drawings surrounded by one-dotted chain lines correspond to the outer shape of the chip 10. Further, FIG. 30 through FIG. 33 respectively illustrate a plane pattern of the wiring 23 formed at the wiring layer of the first layer, a plane pattern constituted by adding the wiring 23A formed at the wiring layer the same as that of the wiring 23 to the plane pattern of FIG. 30, a plane pattern of the wiring 26 formed at the wiring layer of the second layer, and a plane pattern constituted by adding the wiring 26A formed at the wiring layer the same as that of the wiring 26 to the plane pattern of FIG. 32.

Even when the plane patterns of the wirings of the respective wiring layers in the thin film sheet 2 are formed to be able to carry out the probe testing in one motion for two pieces of the chip 10 contiguous in the diagonal line direction (diagonally) as described above, at regions constituting vicinities of the probes 7A, 7B in a plane view thereof, the plane patterns of the respective wires are formed such that the wiring 23 and the wiring 26 electrically connected to the wiring 23 or the wiring 26A which is not electrically connected to the wiring 23 overlap each other. Further, at upper portions of the probes 7A, 7B, there is constituted a plane pattern of arranging both of the wiring 23 and the wiring 26 (or wiring 26A). Thereby, the thickness of the thin film sheet 2 can be made to be uniform at respective upper portions of the probes 7A, 7B and therefore, in the probe testing, the load applied from the press piece 9 (refer to FIG. 3) can be uniformly applied to the respective probes 7A, 7B. As a result, the performance of bringing each of the probes 7A, 7B and the corresponding pads 11 into contact with each other can be promoted. Further, similar to the thin film sheet 2 when the probe testing is carried out in one motion for two adjacent pieces of the chips 10 which are opposed to each other at the one side, in the respective wirings layers in the thin film sheet 2, the wirings 23A, 26A are arranged such that the interval of arranging the wirings and the density of arranging the wirings become uniform. Thereby, the rigidity and the thickness can be made to be uniform particularly in the vicinity of the probes 7A, 7B in the thin film sheet 2 and therefore, in the vicinity of the probes 7A, 7B, the thin film sheet 2 can be prevented from being wrinkled or bent. That is, the performance of bringing each of the probes 7A, 7B and the corresponding pads 11 into contact with each other can be promoted.

Embodiment 2

Although in Embodiment 1, an explanation has been given of the plane patterns of the wirings of the respective wiring layers in the thin film sheet 2 when there is a restriction in allocating channels in the probe card of Embodiment 1, in Embodiment 2, an explanation will be given of an example when there is not a restriction in allocating channels in the probe card.

Figure 34:
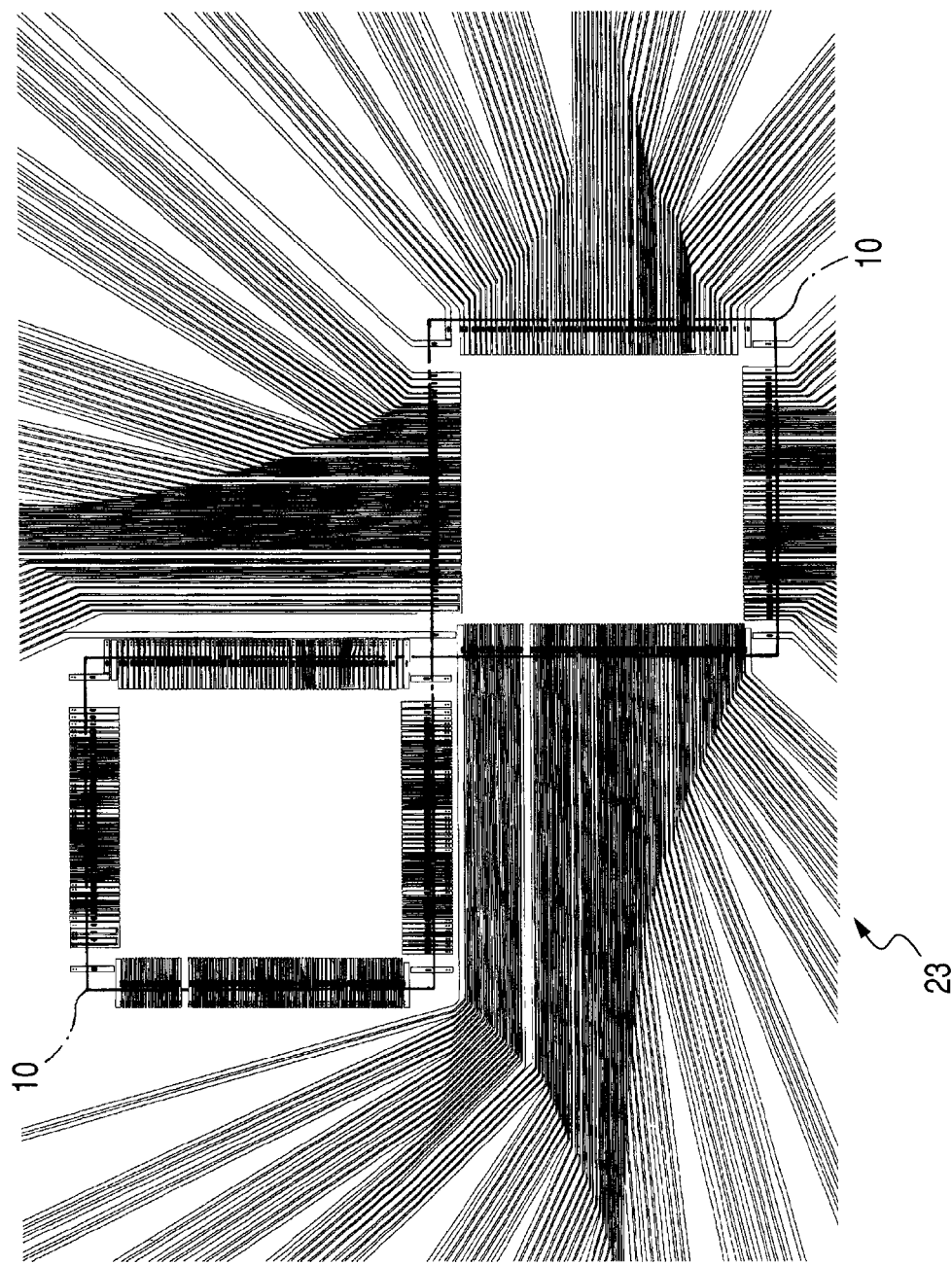
FIG. 34 is a plane view of an essential portion of a thin film sheet forming a probe card according to Embodiment 2 of the invention.
Figure 35:
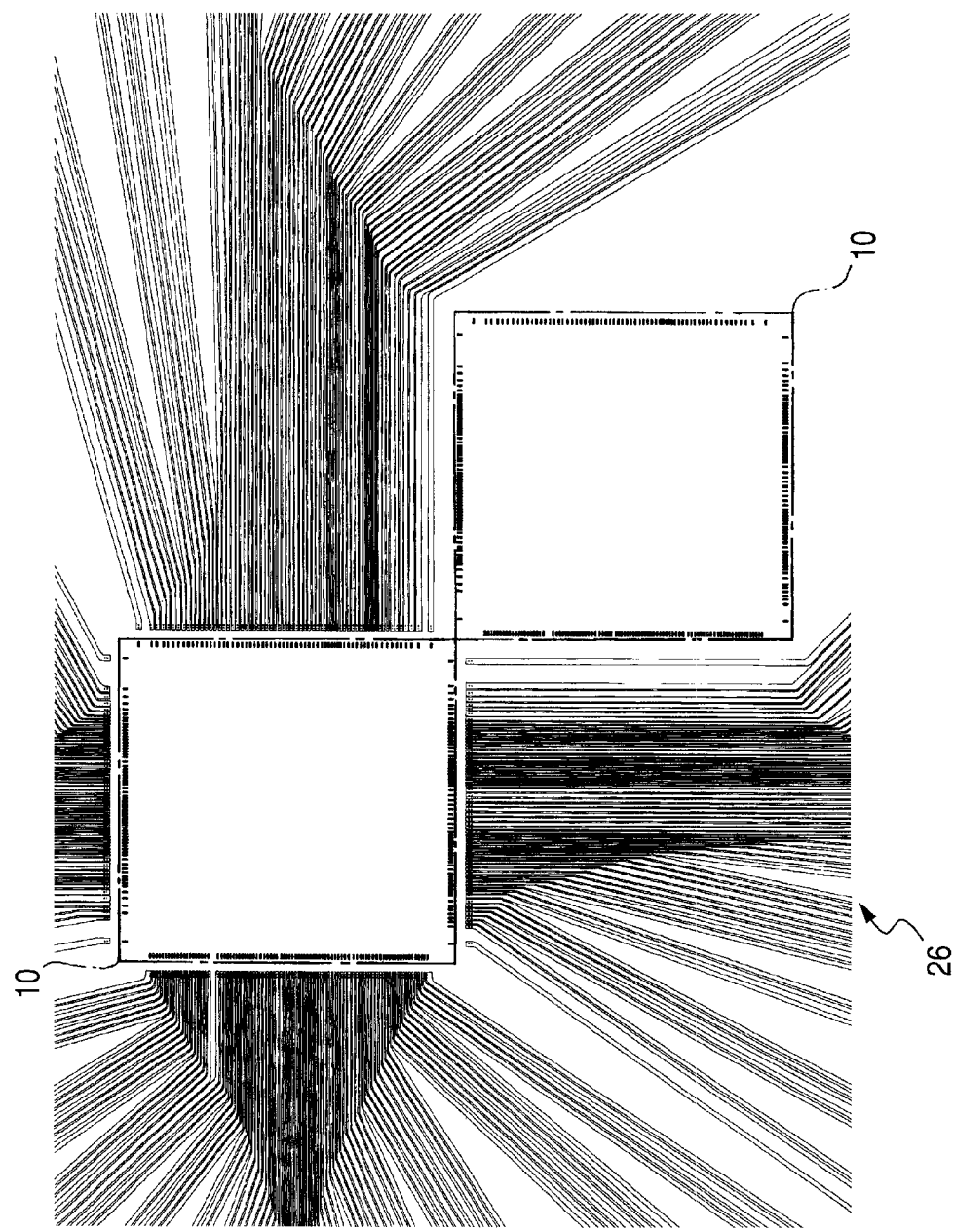
FIG. 35 is a plane view of an essential portion of a thin film sheet forming a probe card according to Embodiment 2 of the invention.

In Embodiment 2, the probe testing is carried out in one motion for two pieces of the chips 10 contiguous to each other in the diagonal line direction (diagonally). Here, FIG. 34 and FIG. 35 are plane views of essential portions showing a region in correspondence with two pieces of the chip 10 constituting a testing object in the thin film sheet 2, and regions in the drawings surrounded by one-dotted chain lines correspond to the outer shape of the chip 10. Further, FIG. 34 and FIG. 35 respectively illustrate a plane pattern of the wiring 23 formed at the wiring layer at the first layer and a plane pattern of the wiring 26 formed at the wiring layer of the second layer. By constituting a specification in correspondence with two pieces of the chips 10 contiguous to each other in the diagonal line direction in this way, the wiring 23 or the wiring 26 can be led out in all of directions by a narrow pitch in a plane view thereof at a position in correspondence with the single chip 10.

Also in Embodiment 2, similar to Embodiment 1, a portion of the wiring 23 electrically connected to the metal films 21A, 21B (refer to FIG. 7 through FIG. 9) is led around to the outer periphery of the thin film sheet 2, and is electrically connected to a corresponding one of the plural receiving portions provided at the multilayer wiring substrate 1 (refer to FIG. 1 and FIG. 2). Further, the other wiring 23 is connected with the wiring 26, the respective wirings 26 are led around to the outer periphery of the thin film sheet 2, and is electrically connected to corresponding ones of the plural receiving portions provided at the multilayer wiring substrate 1.

Figure 36:
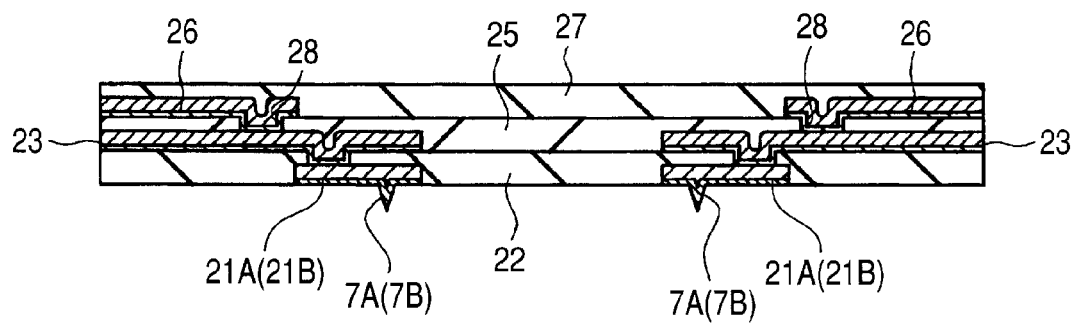
FIG. 36 is a sectional view of an essential portion of a thin film sheet forming a probe card according to Embodiment 2 of the invention.
Figure 37:
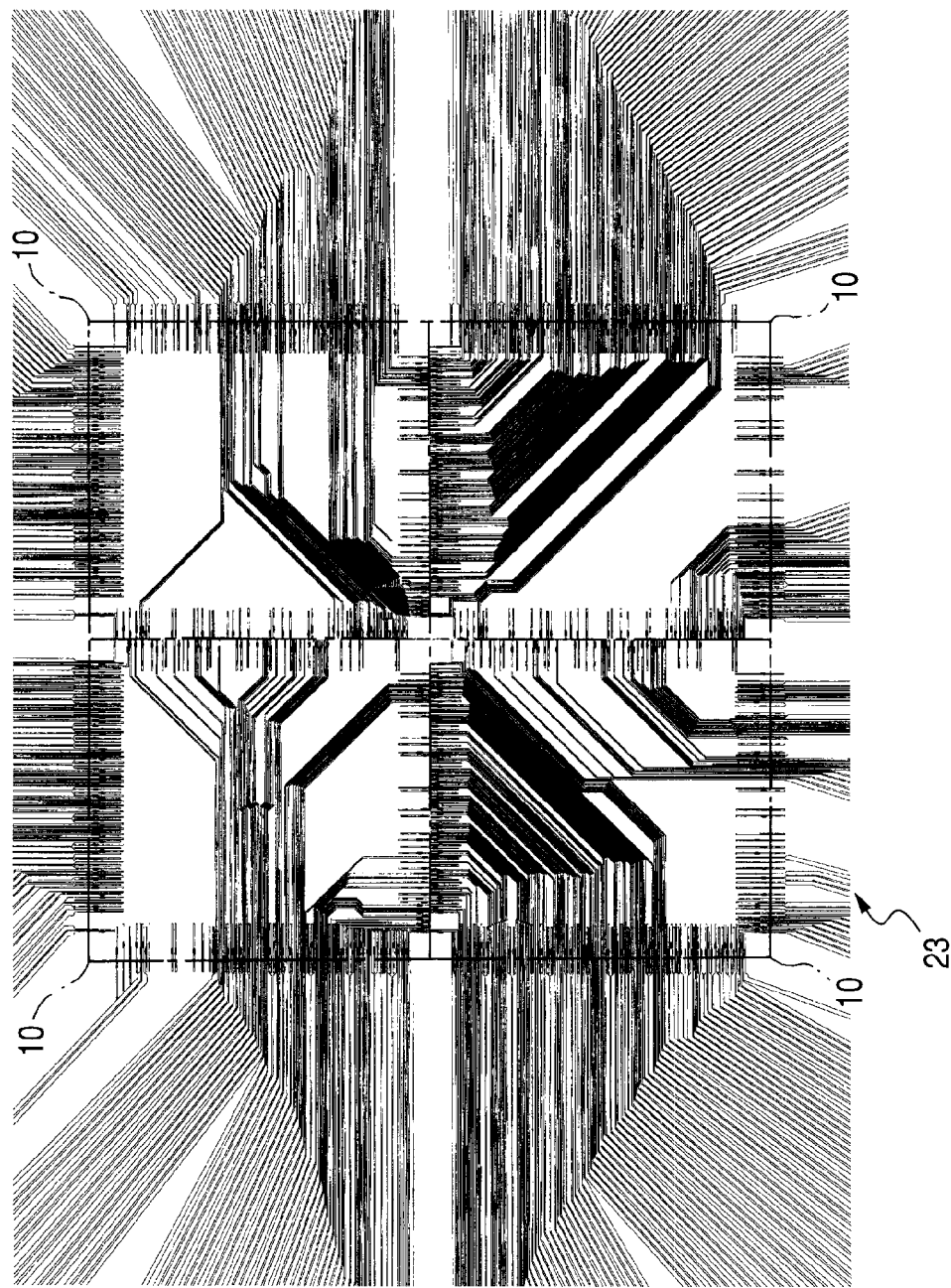
FIG. 37 is a plane view of an essential portion of a thin film sheet forming a probe card according to Embodiment 2 of the invention.
Figure 38:
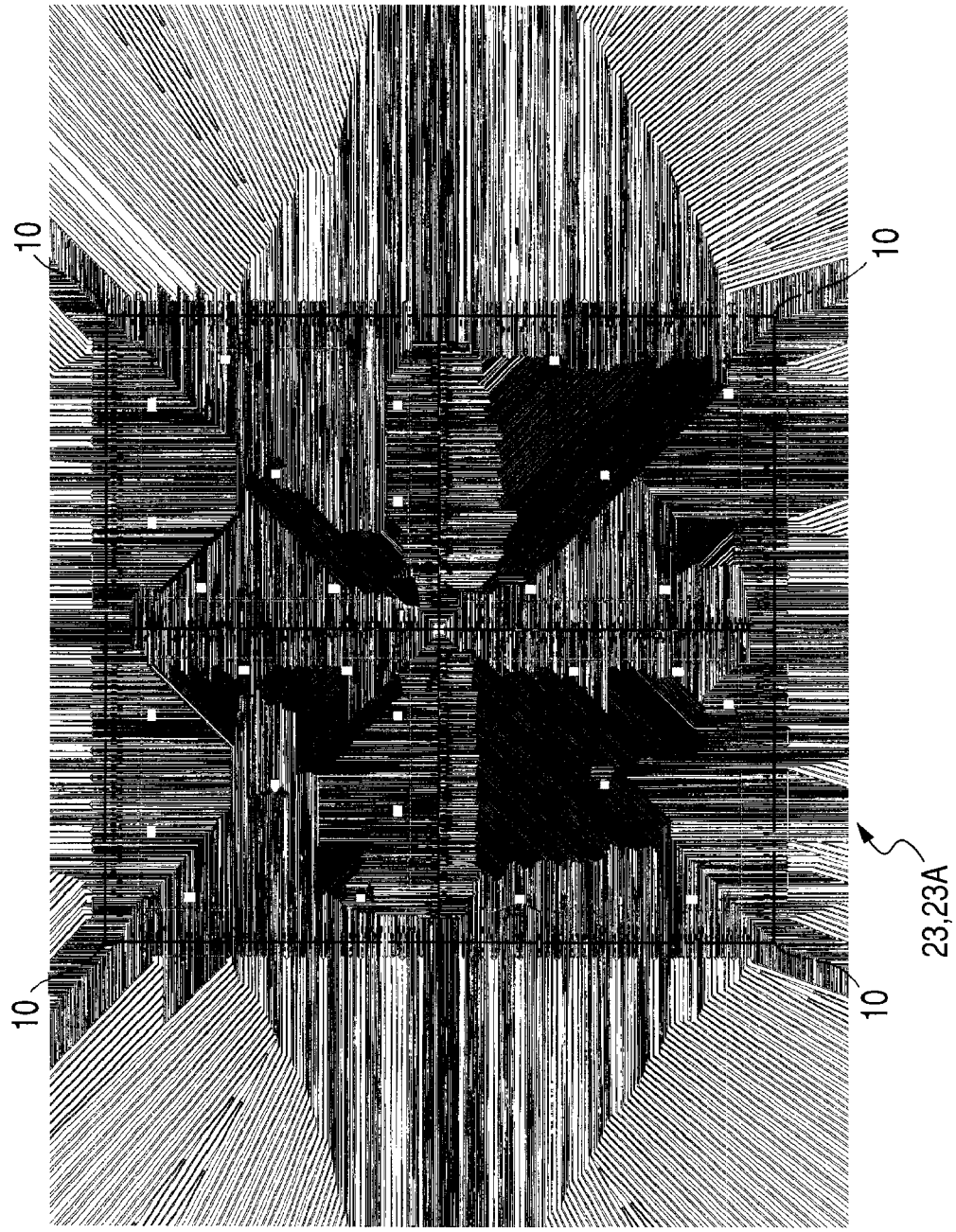
FIG. 38 is a plane view of an essential portion of a thin film sheet forming a probe card according to Embodiment 2 of the invention.
Figure 39:
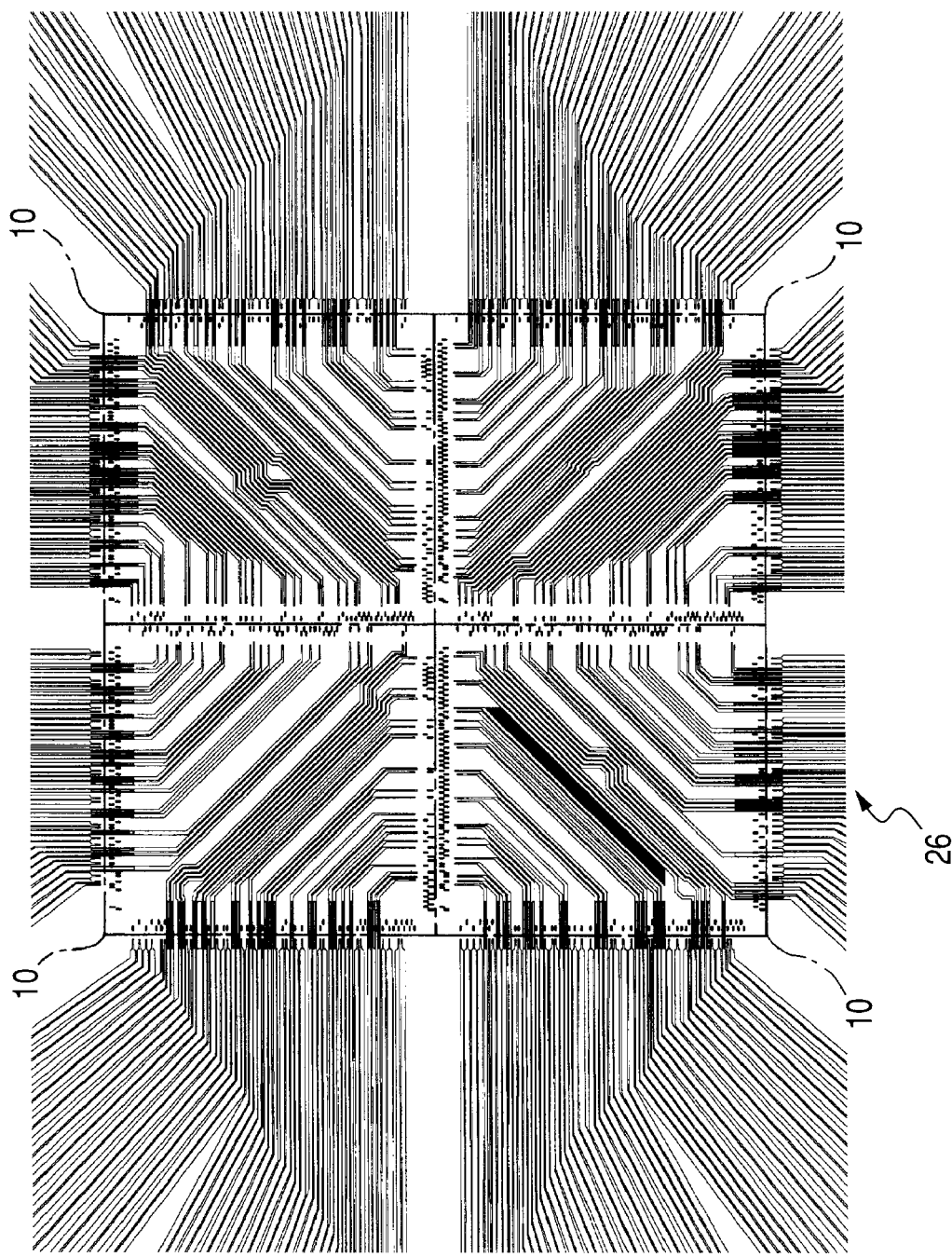
FIG. 39 is a plane view of an essential portion of a thin film sheet forming a probe card according to Embodiment 2 of the invention.
Figure 40:
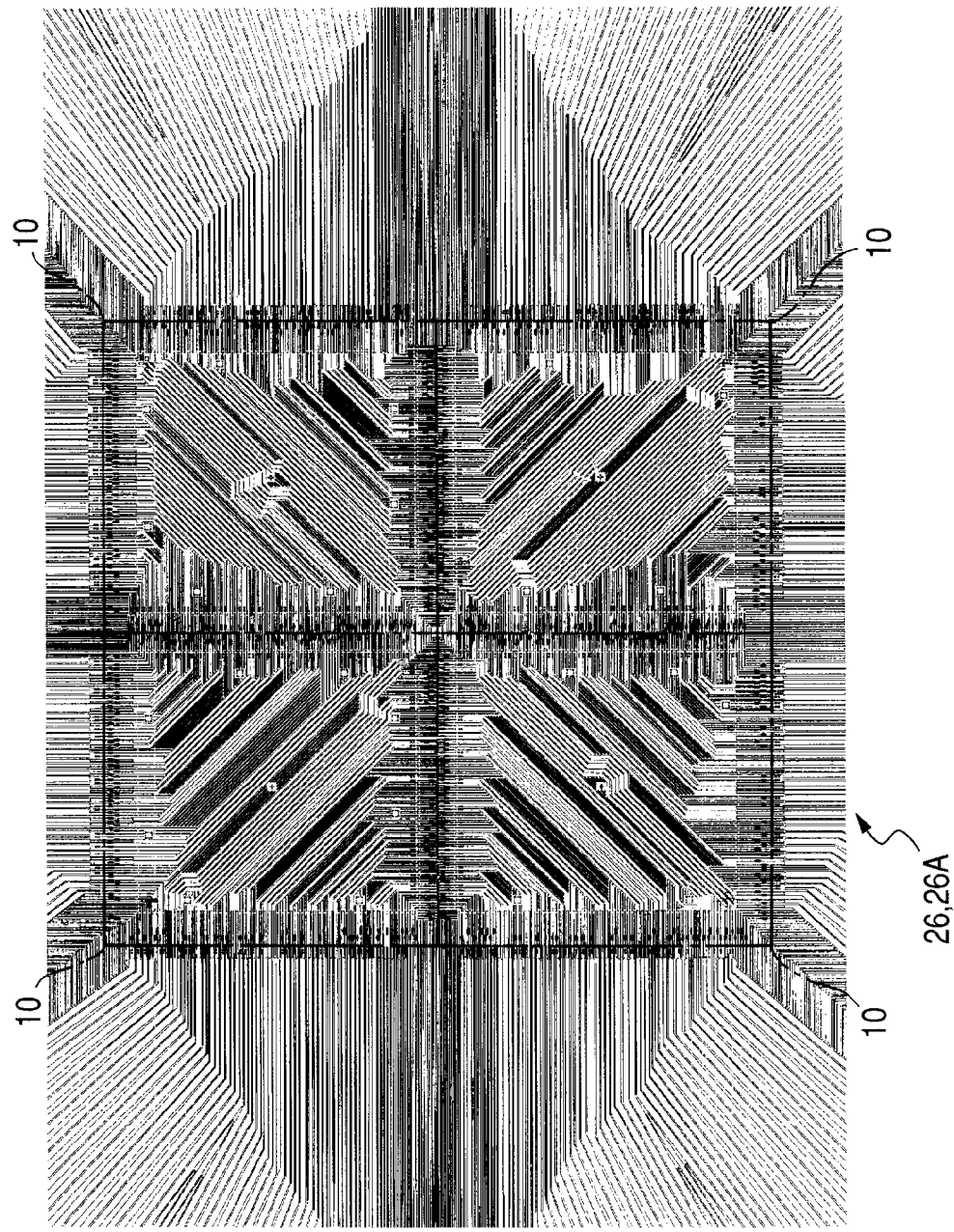
FIG. 40 is a plane view of an essential portion of a thin film sheet forming a probe card according to Embodiment 2 of the invention.

Further, although in Embodiment 2, similar to Embodiment 1, plane patterns of respective wirings are formed such that the wiring 23 and the wiring 26 electrically connected to the wiring 23 or the wiring 26A which is not electrically connected to the wiring 23 overlap each other in regions constituting vicinities of the probes 7A, 7B in a plane view thereof, however, there is constituted a pattern in which at upper portions of the probes 7A, 7B (metal films 21A, 21B), only the wiring 23 at lower layer (first wiring layer) relatively lower than the wiring 26 is arranged and the wiring 26 (or wiring 26A) is not arranged (refer to FIG. 36). By constituting such a pattern of the wirings 23, 26, the thickness of the thin film sheet 2 can be made to be uniform at the respective upper portions of the probes 7A, 7B. Thereby, in the probe testing, the load applied from the press piece 9 (refer to FIG. 3) can be applied to the respective probes 7A, 7B uniformly. As a result, the performance of bringing each of the probes 7A, 7B and the corresponding pads 11 (refer to FIG. 6 and FIG. 10) into contact with each other can be promoted. Further, in the vicinity of the probes 7A, 7B (metal films 21A, 21B) by not arranging the wiring 26, the rigidity can be made to be lower than that of the other portion and therefore, the performance of bringing respectives of the probes 7A, 7B and the corresponding pads 11 into contact with each other can be promoted more than that of Embodiment 1.

Further, also in Embodiment 2, similar to Embodiment 1, in the respective wiring layers in the thin film sheet 2, patterns of the wirings 23, 23A, 26, 26A are formed such that the interval of arranging the wirings and the density of arranging the wirings become uniform. By forming the patterns of wirings such that the interval of arranging the wirings and the density of arranging the wirings become uniform in the respective wiring layers in the thin film sheet 2, the rigidity and the thickness can be made to be uniform particularly in the vicinity of the probes 7A, 7B in the thin film sheet 2. Thereby, the thin film sheet 2 can be prevented from being wrinkled and bent in the vicinity of the probes 7A, 7B and therefore, the performance of bringing each of the probes 7A, 7B and the corresponding pads 11 into contact with each other can be promoted.

Although in FIG. 34 and FIG. 35, there is shown the plane patterns of wirings in the thin film sheet 2 when the probe testing is carried out in one motion for two pieces of the chips 10 contiguous to each other in the diagonal line direction (diagonally), the plane patterns of the wirings of the respective wiring layers in the thin film sheet 2 may be formed such that the probe testing can be carried out in one motion for a total of four pieces of the chip 10 including two adjacent pieces of the chips 10 which are opposed to the two pieces of the chips 10 at one side thereof. Here, FIG. 37 through FIG. 40 are plane views of essential portions showing regions in correspondence with four pieces of the chips 10 constituting the testing object in the thin film sheet 2, regions in the drawings surrounded by one-dotted chain lines correspond to the outer shape of the chip 10. Further, FIG. 37 through FIG. 40 respectively illustrate a plane pattern of the wiring 23 formed at the wiring layer of the first layer, a plane pattern constituted by adding the wiring 23A formed at the wiring layer the same as that of the wiring 23 to the plane pattern of FIG. 37, a plane pattern of the wiring 26 formed at the wiring layer at the second layer, and a plane pattern constituted by adding the wiring layer 26A formed at the wiring layer the same as that of the wiring 26 to the plane pattern of FIG. 39.

Even when the plane patterns of the wirings of the respective wiring layers in the thin film sheet 2 are formed to be able to carry out the probe testing in one motion for four pieces of the chip 10, at regions constituting vicinities of the probes 7A, 7B in a plane view thereof, the plane patterns of the respective wirings are formed such that the wiring 23 and the wiring 26 electrically connected to the wiring 23 or the wiring 26A which is not electrically connected to the wiring 23 overlap each other, there is constituted a pattern in which at upper portions of the probes 7A, 7B (metal films 21A, 21B), only the wiring 23 at the layer relatively lower than the wiring 26 is arranged and the wiring 26 (or wiring 26A) is not arranged (refer to FIG. 36). The thickness of the thin film sheet 2 can be made to be uniform at respective upper portions of the probes 7A, 7B by constituting such a pattern of the wirings 23, 26. Thereby, in the probe testing, the load applied from the press piece 9 (refer to FIG. 3) can be uniformly applied to the respective probes 7A, 7B. As a result, the performance of bringing each of the probes 7A, 7B and the corresponding pads 11 (refer to FIG. 6 and FIG. 10) into contact with each other can be promoted. Further, by not arranging the wiring 26 in the vicinity of the probes 7A, 7B (metal films 21A, 21B) in the thin film sheet 2, the rigidity can be made to be lower than that of the other portion and therefore, the performance of bringing each of the probes 7A, 7B and the corresponding pads 11 into contact with each other can be promoted more than that of Embodiment 1.

Although in Embodiment 2, an explanation has been given of a case in which the plane patterns of the wirings of the respective wiring layers in the thin film sheet 2 are formed to be able to carry out the probe testing in one motion for two pieces or four pieces of the chips 10, the selected chips 10 are not limited to two pieces or four pieces but any number of pieces thereof will do so far as the wirings 23, 23A, 26, 26A can be led around by the above-described patterns.

An effect similar to that of Embodiment 1 can be achieved also by Embodiment 2 mentioned above.

Embodiment 3

In Embodiment 3, an explanation will be given of plane patterns of wirings in the thin film sheet 2 when the probe testing is carried out in one motion for two pieces of the chips 10 aligned to be remote from each other by an interval in correspondence with one or more pieces of the chip 10 in the wafer WH (refer to FIG. 5).

Figure 41:
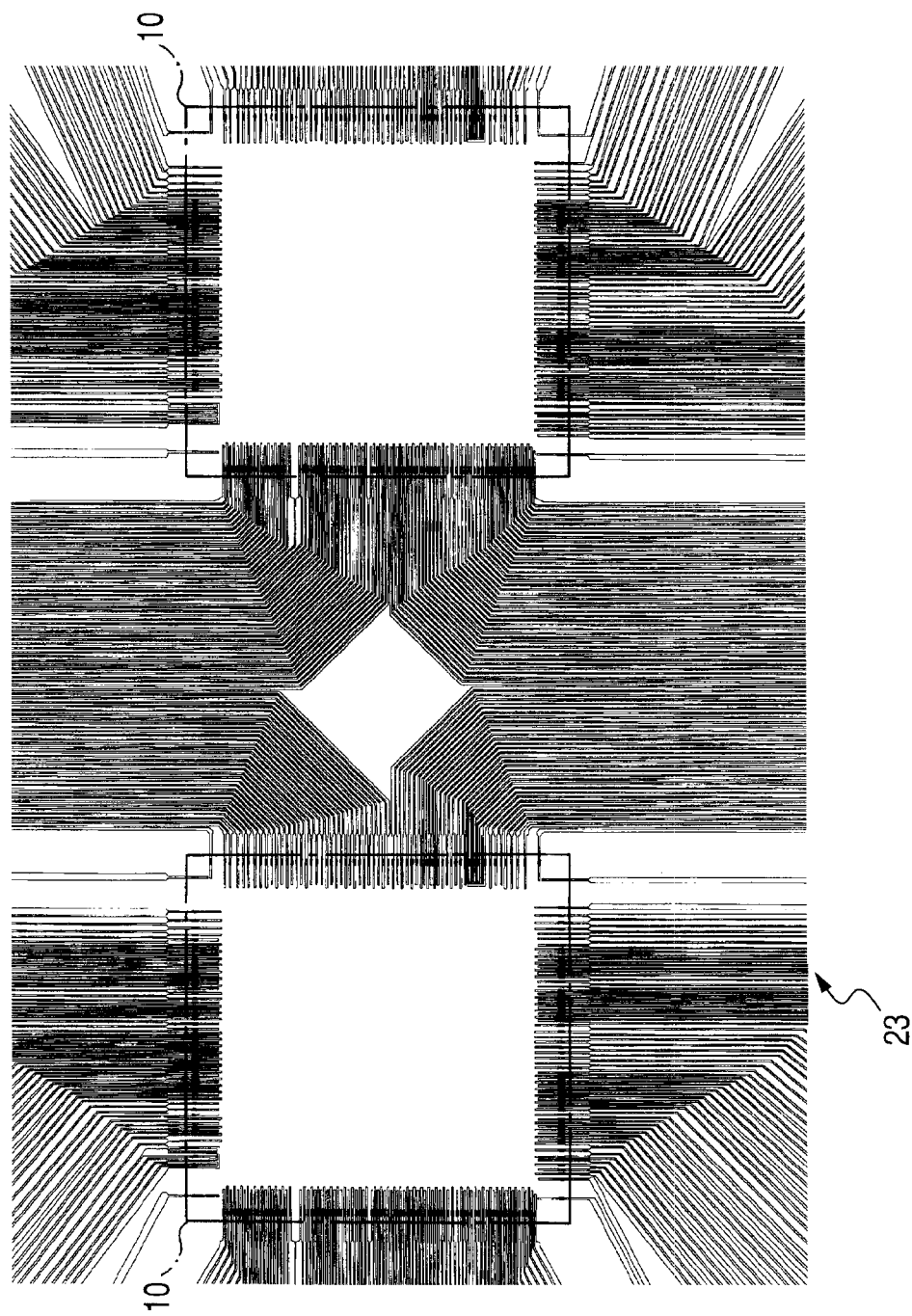
FIG. 41 is a plane view of an essential portion of a thin film sheet forming a probe card according to Embodiment 3 of the invention.
Figure 42:
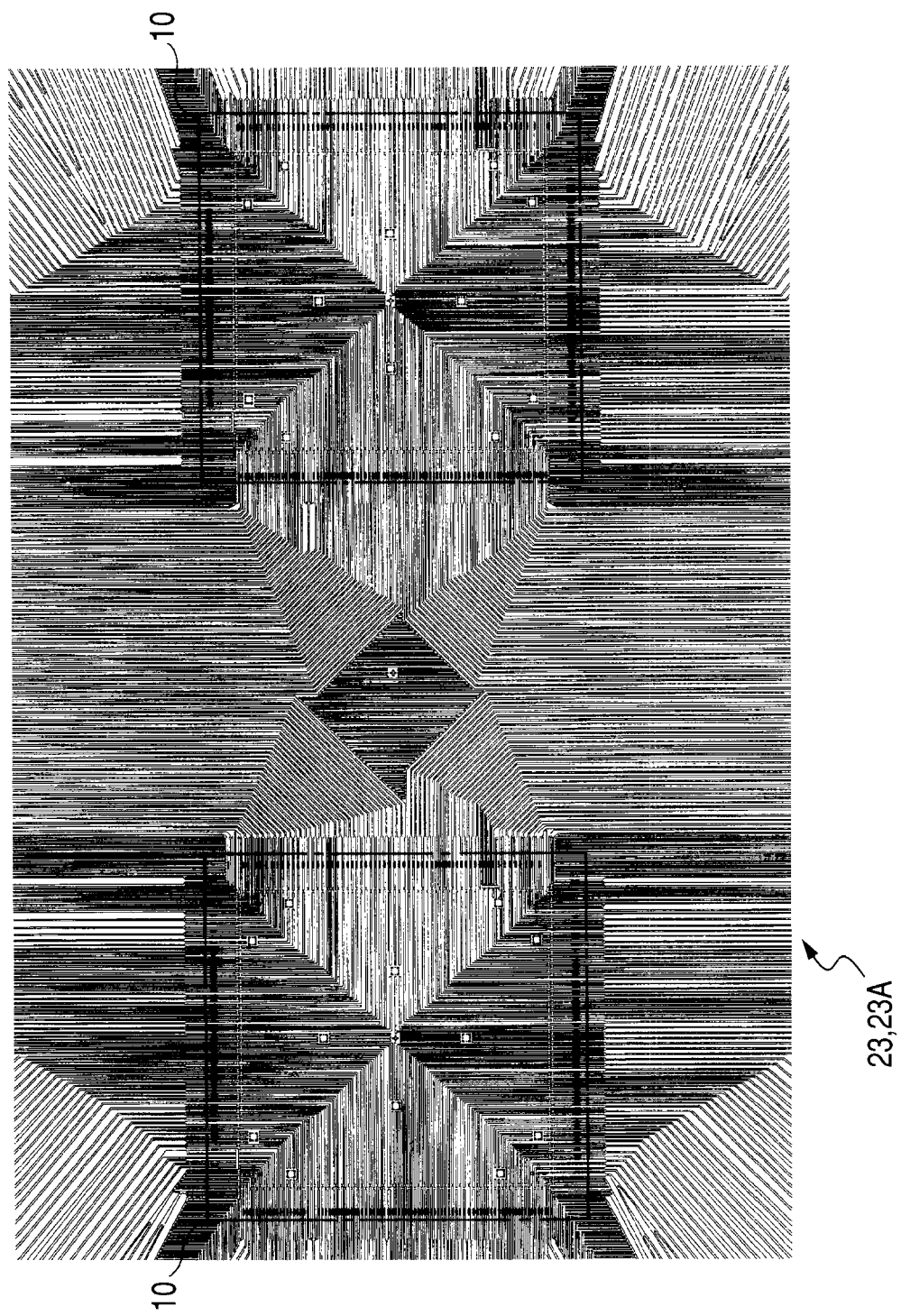
FIG. 42 is a plane view of an essential portion of a thin film sheet forming a probe card according to Embodiment 3 of the invention.

FIG. 41 and FIG. 42 are plane views of essential portions showing a region in correspondence with two pieces of the chips 10 constituting the testing object in the thin film sheet 2, and regions in the drawings surrounded by one-dotted chain lines correspond to the outer peripheral shape of the chip 10. Further, FIG. 41 and FIG. 42 respectively illustrate a plane pattern of the wiring 23 formed at the wiring layer at the first layer, and a plane pattern constituted by adding the wiring 23A formed at the wiring layer the same as that of the wiring 23 to the plane pattern of FIG. 41.

Also in Embodiment 3, similar to Embodiment 1, a portion of the wiring 23 electrically connected to the metal films 21A, 21B (refer to FIG. 7 through FIG. 9) is led around to the outer periphery of the thin film sheet 2 and is electrically connected to a corresponding one of the plural receiving portions provided at the multilayer wiring substrate 1 (refer to FIG. 1 and FIG. 2). Further, in Embodiment 3, the wiring in the thin film sheet 2 is formed by a single layer of the wiring layer including the wirings 23, 23A.

Further, also in Embodiment 3, similar to Embodiment 1, a pattern of the wirings 23, 23A is formed such that the interval of arranging the wirings and the density of arranging the wirings become uniform in the wiring layer in the thin film sheet 2. By forming the pattern of the wirings such that the interval of arranging the wirings and the density of arranging the wirings become uniform in the wiring layer of the thin film sheet 2, the rigidity and the thickness can be made to be uniform particularly in the vicinity of the probes 7A, 7B in the thin film sheet 2. Thereby, the thin film sheet 2 can be prevented from being wrinkled and bent in the vicinity of the probes 7A, 7B and therefore, the performance of bringing respective of the probes 7A and 7B and the corresponding pads 11 into contact with each other can be promoted.

According to the thin film sheet 2 of Embodiment 3 having the pattern of the wirings 23, 23A as described above, the structure of the thin film sheet 2 is formed to select two pieces of the chip 10 by separating the interval. Thereby, in thin film sheet 2, wirings 23, 23A can be led out by a narrow pitch by constituting the wiring layer only by a single layer. As a result, the rigidity can be made to be low at a total of the thin film sheet 2 and therefore, the performance of bringing each of the probes 7A, 7B and the corresponding pads 11 into contact with each other can be promoted more than that of Embodiment 1.

An effect similar to that of Embodiment 1 can be achieved also by Embodiment 3 mentioned above.

Embodiment 4

Although in Embodiment 1, there is exemplified the chip of the SoC structure formed with the semiconductor integrated circuit having plural functions as an object of carrying out probe testing (electric testing), in Embodiment 4, a chip formed with an LCD (Liquid Crystal Display) driver will be exemplified.

Figure 43:
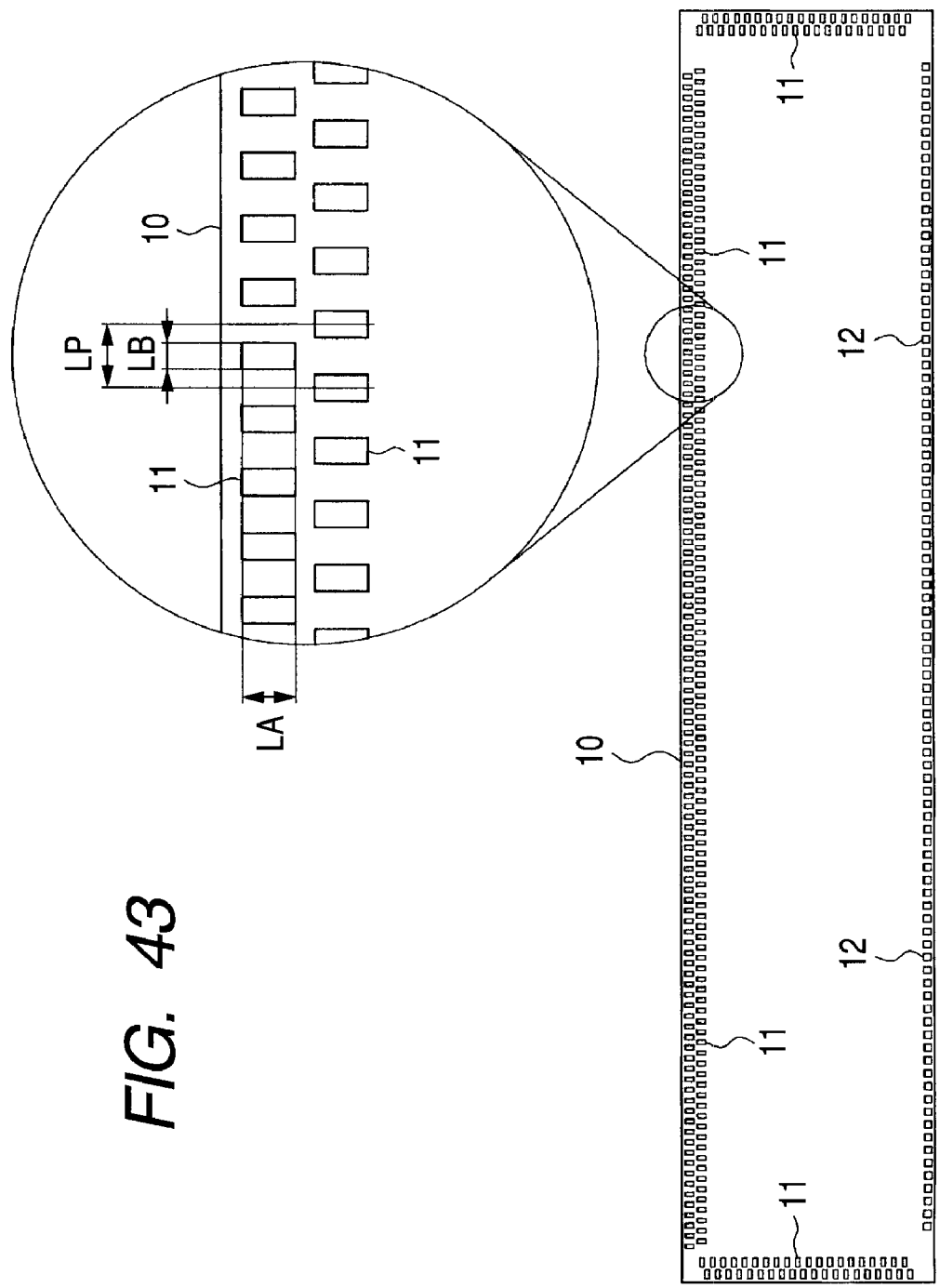
FIG. 43 is a plane view of a semiconductor chip constituting an object of carrying out probe testing by using a probe card according to Embodiment 4 of the invention.

FIG. 43 illustrates a plane of the chip 10 and an enlarged portion thereof. The chip 10 comprises, for example, a single crystal silicon substrate, and a main face thereof is formed with an LCD driver circuit. Further, a peripheral portion of the main face of the chip 10 is arranged with numbers of pads (test pads (first electrodes)) 11, 12 for being electrically connected to the LCD driver circuit, the pads 11 aligned along a long side on an upper side and two short sides of the chip 10 in FIG. 43 constitute output terminals, and the pads 12 aligned along a long side on a lower side of the chip 10 constitute input terminals. Since a number of the output terminals of the LCD driver is larger than a number of the input terminals, in order to make an interval of the pads 11 contiguous to each other as wide as possible, the pads 11 are aligned in two rows along the long side on the upper side and the two short sides of the chip 10, and the pads 11 of the respective rows are aligned in zigzag along the long side on the upper side and the two short sides of the chip 10. In Embodiment 1, a pitch LP of arranging the contiguous pads 11 is, for example, about 68 µm. Further, in Embodiment 1, the pad 11 is constituted by a rectangular shape in a plane view thereof, a length LA of a long side extended in a direction of being intersected with (orthogonal to) an outer periphery of the chip 10 is about 63 µm and a length LB of a short side extended along the outer periphery of the chip 10 is about 34 µm. Further, since the pitch LP of arranging the contiguous pads 11 is about 68 µm and the length LB of the short side of the pad 11 is about 34 µm, an interval of the pads 11 contiguous to each other becomes about 34 µm.

Figure 44:
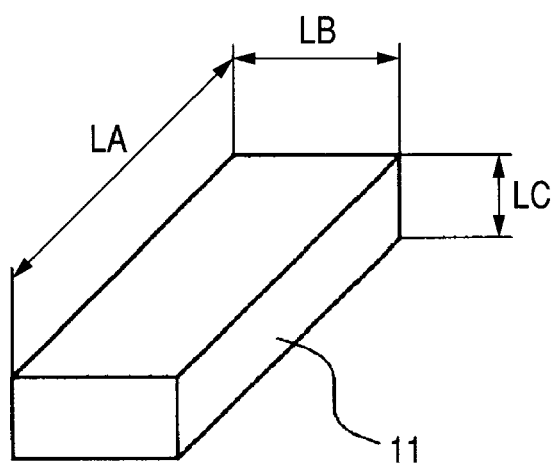
FIG. 44 is a perspective view of a pad formed at a semiconductor chip shown in FIG. 43.

The pads 11, 12 are bump electrodes (projected electrodes) formed by, for example, Au (gold), and formed on input/output terminals (bonding pads) of the chip 10 by a method of electrolytic plating, electroless plating, vapor deposition or sputtering. FIG. 44 is a perspective view of the pad 11. A height of LC of the pad 11 is about 15 µm and also the pad 12 is provided with a height to the same degree.

Further, the chip 10 can be fabricated by forming LCD driver circuit (semiconductor integrated circuit) and input/output terminals (bonding pads) at a number of the chip regions partitioned at the main face of the wafer by using a semiconductor manufacturing technique, successively forming the pads 11 on the input/output terminals by the above-described method, thereafter segmenting the chip regions by dicing the wafer. Further, in Embodiment 4, the probe testing is carried out for the respective chip regions before dicing the wafer. Further, in explaining the probe testing (step of bringing the pads 11, 12 and the probe 7 into contact with each other) hereinafter, the chip 10 indicates each chip region before dicing the wafer when not clearly described otherwise particularly.

Figure 45:
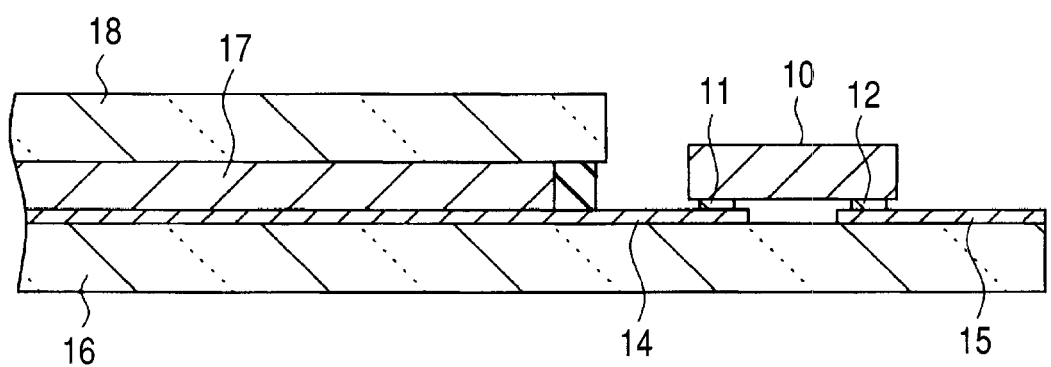
FIG. 45 is a sectional view of an essential portion showing a method of connecting a semiconductor chip shown in FIG. 43 to a liquid crystal panel.
Figure 46:
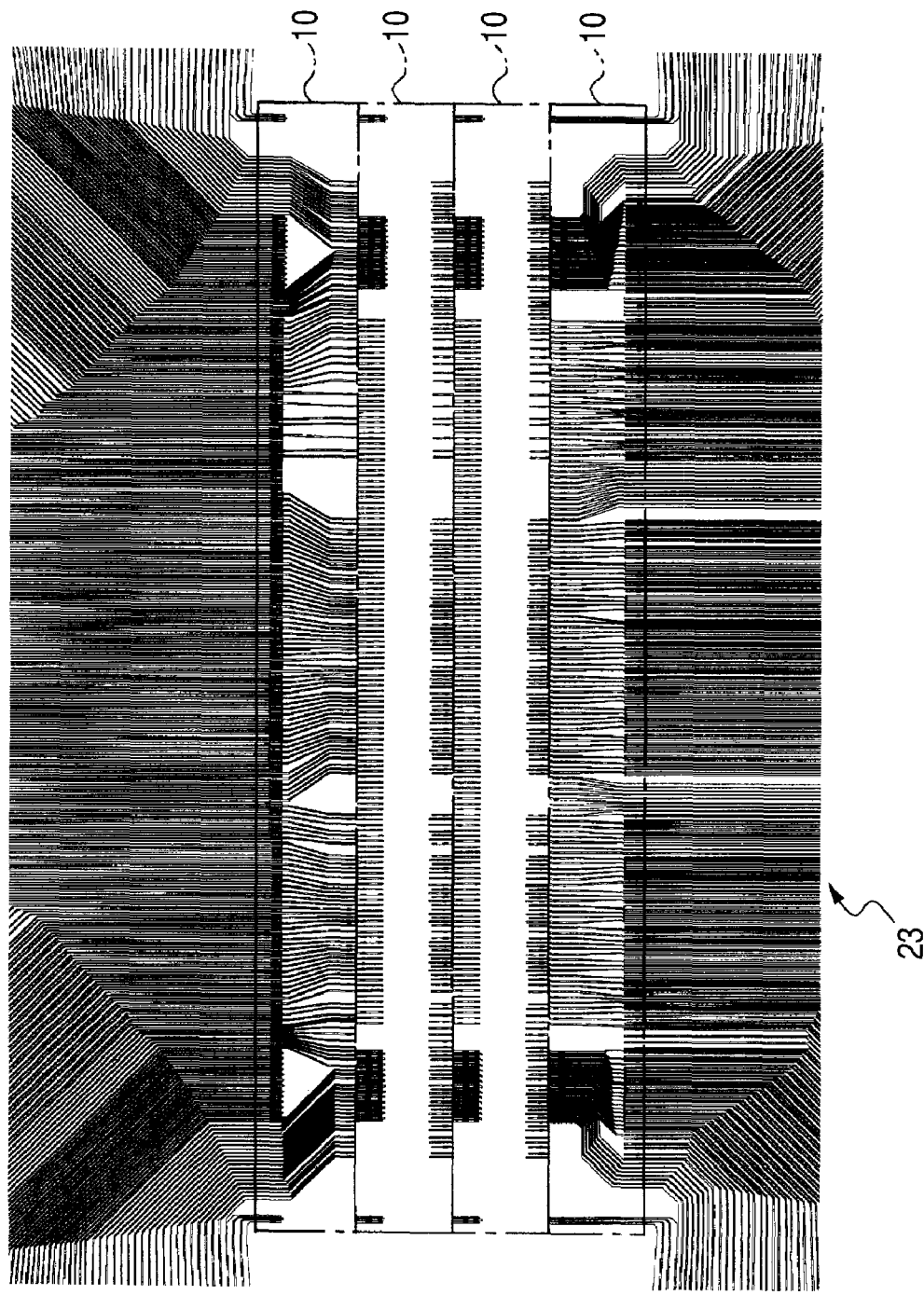
FIG. 46 is a plane view of an essential portion of a thin film sheet forming a probe card according to Embodiment 4 of the invention.
Figure 47:
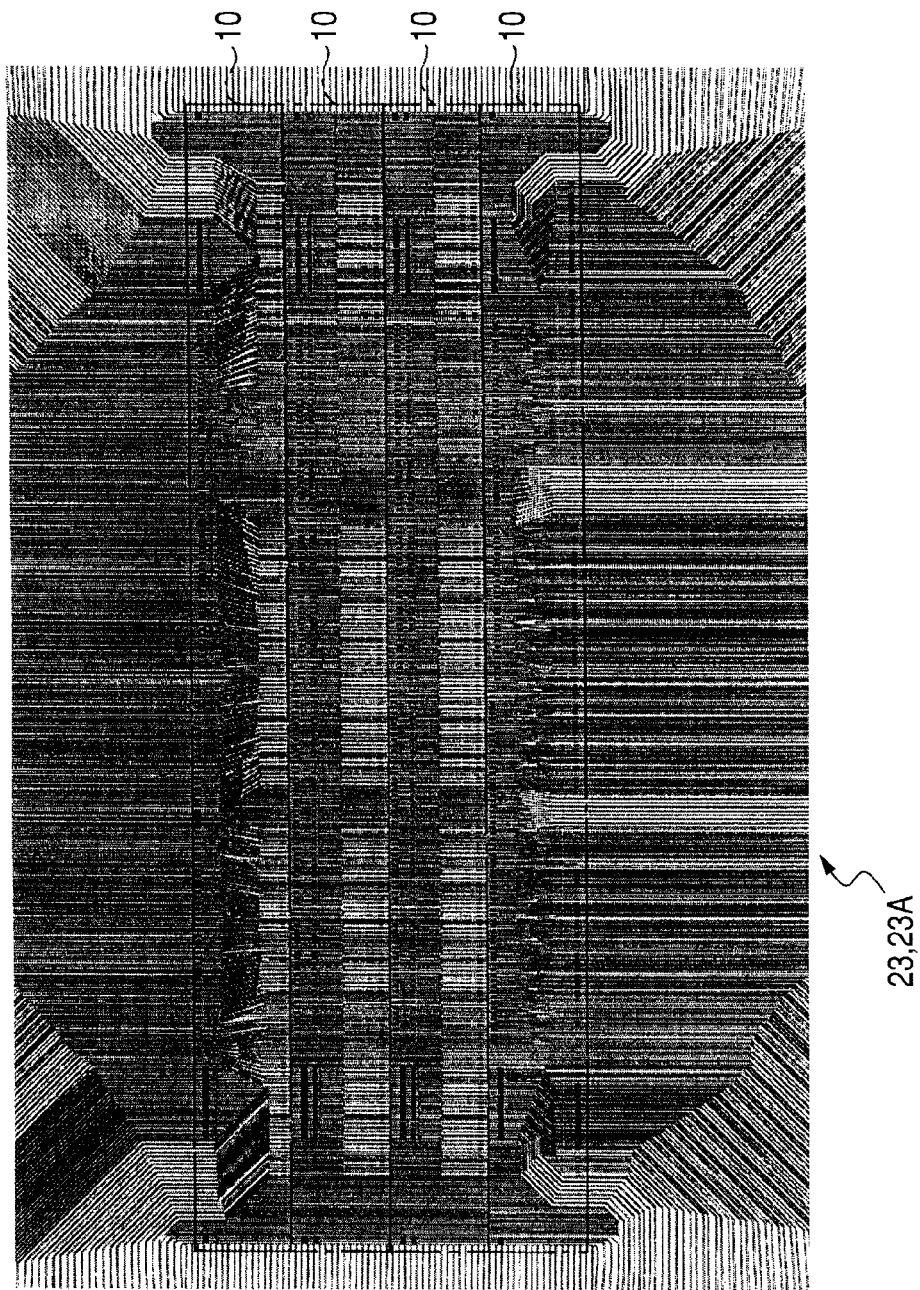
FIG. 47 is a plane view of an essential portion of a thin film sheet forming a probe card according to Embodiment 4 of the invention.
Figure 48:
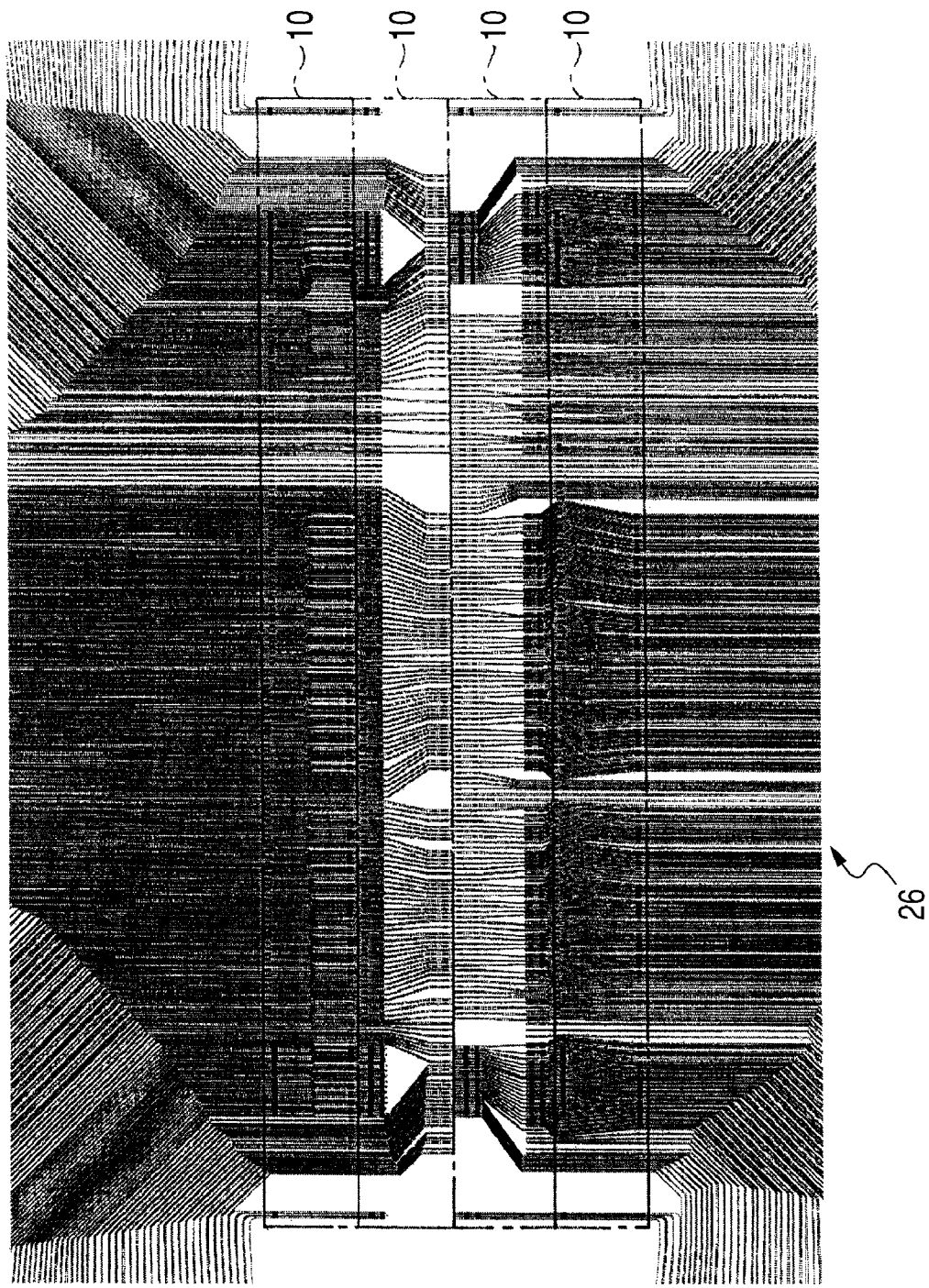
FIG. 48 is a plane view of an essential portion of a thin film sheet forming a probe card according to Embodiment 4 of the invention.
Figure 49:
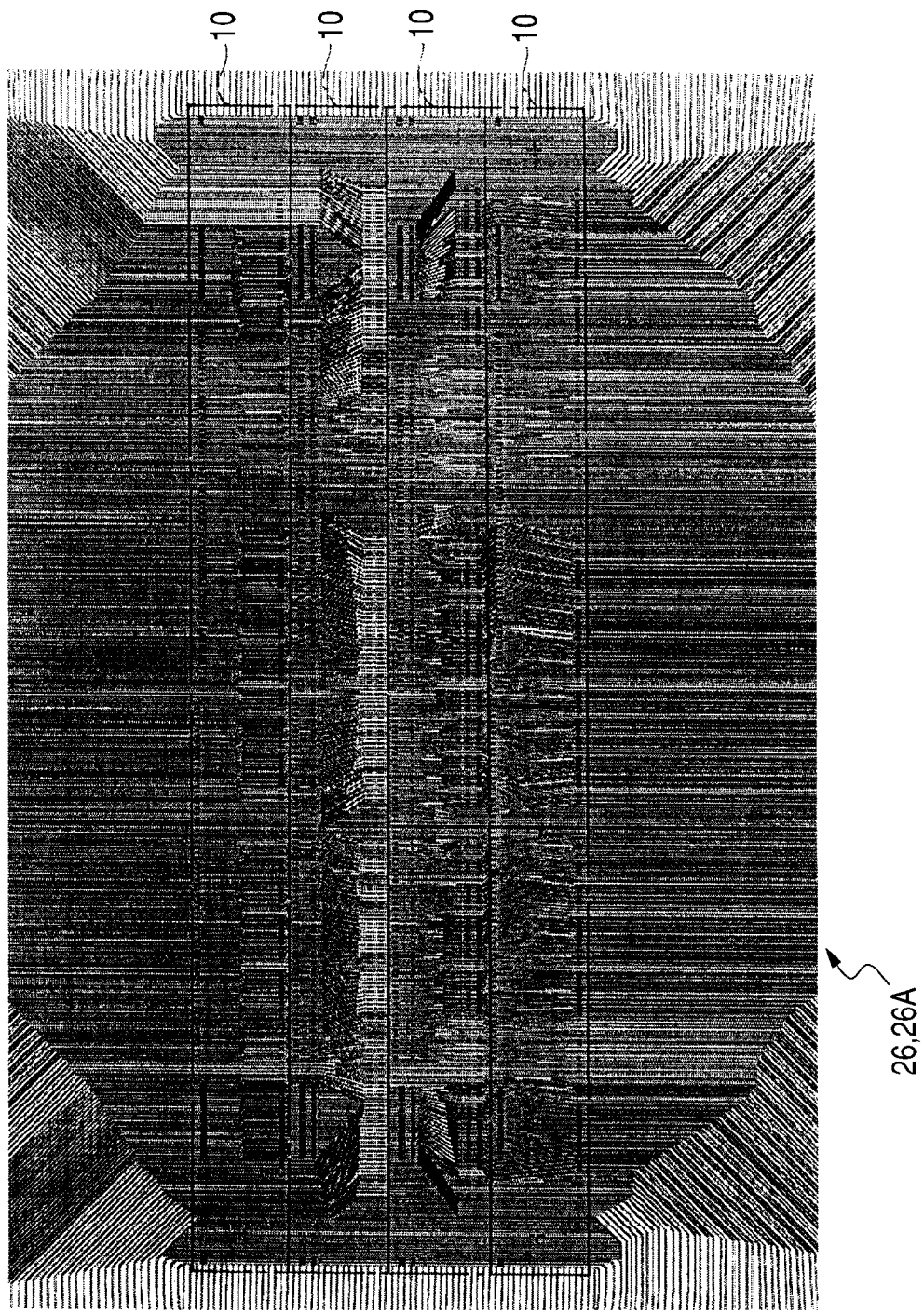
FIG. 49 is a plane view of an essential portion of a thin film sheet forming a probe card according to Embodiment 4 of the invention.

FIG. 45 is a sectional view of an essential portion showing a method of connecting the chip 10 to a liquid crystal panel. As shown by FIG. 45, the liquid crystal panel is formed by a glass substrate 16 formed with pixel electrodes 14, 15 at, for example, a main face thereof, a liquid crystal layer 17, and a glass substrate 18 arranged to be opposed to the glass substrate 16 by way of the liquid crystal layer 17. According to Embodiment 4, it can be exemplified to connect the chip 10 to the liquid crystal panel by subjecting the chip 10 to face down bonding to respectively connect the pads 11, 12 to the pixel electrodes 14, 15 of the glass substrate 16 of the liquid crystal panel.

In Embodiment 4, the probe testing is carried out in one motion for four contiguous pieces of chip 10 adjacent and opposed to each other at the long sides. Here, FIG. 46 through FIG. 49 are plane views of essential portions showing a region of the thin film sheet 2 in correspondence with four pieces of chip 10 constituting the testing object, and regions in the drawings surrounded by one-dotted chain lines correspond to the outer shape of the chip 10. Further, FIG. 46 through FIG. 49 respectively illustrate a plane pattern of the wiring 23 formed at the wiring layer of the first layer, a plane pattern constituted by adding the wiring 23A formed at the wiring layer the same as that of the wiring 23 to the plane pattern of FIG. 46, a plane pattern of the wiring 26 formed at the wiring layer of the second layer, and a plane pattern constituted by adding the wiring 26A formed at the wiring layer the same as that of the wiring 26 to the plane pattern of FIG. 48.

Also in Embodiment 4, similar to Embodiment 1, a portion of the wiring 23 electrically connected to the metal films 21A, 21B (refer to FIG. 7 through FIG. 9) is led around to the outer periphery of the thin film sheet 2, and is electrically connected to a corresponding one of the plural receiving portions provided at the multilayer wiring substrate 1 (refer to FIG. 1 and FIG. 2). Further, the other wiring 23 is connected with the wiring 26, the respective wirings 26 are led around to the outer periphery of the thin film sheet 2 and electrically connected to corresponding ones of the plural receiving portions provided at the multilayer wiring substrate 1.

Further, also in Embodiment 4, similar to Embodiment 1, at regions constituting vicinities of the probes 7A, 7B in a plane view thereof, the plane pattern of the respective wirings is formed such that the wiring 23 and the wiring 26 electrically connected to the wiring 23 or the wiring 26A which is not electrically connected to the wiring 23 overlap each other, at upper portions of the probes 7A, 7B, the plane pattern of arranging both of the wiring 23 and the wiring 26 (or wiring 26A) is constituted (refer to FIG. 28 and FIG. 29). By constituting the plane pattern, the thickness of the thin film sheet 2 can be made to be uniform at the respective upper portions of the probes 7A, 7B also in Embodiment 4. Thereby, in the probe testing, the load applied from the press piece 9 (refer to FIG. 3) can uniformly be applied to the respective probes 7A, 7B. As a result, a performance of bringing each of the probes 7A, 7B and the corresponding pads 11 (refer to FIG. 6 and FIG. 10) into contact with each other can be promoted.

Further also in Embodiment 4, similar to Embodiment 1, the patterns of the wirings 23, 23A, 26, 26A are formed such that the interval of arranging the wirings and the density of arranging the wirings become uniform in the respective wiring layers in the thin film sheet 2. By forming the patterns of the wirings such that the interval of arranging the wirings and the density of arranging the wirings become uniform in the respective wiring layers in the thin film sheet 2, the rigidity and the thickness can be made to be uniform particularly in the vicinity of the probes 7A, 7B in the thin film sheet 2. Thereby, in the vicinity of the probes 7A, 7B, the thin film sheet 2 can be prevented from being wrinkled and bent and therefore, the performance of bringing each of probes 7A, 7B and the corresponding pads 11 into contact with each other can be promoted.

An effect similar to that of Embodiment 1 can be achieved also by Embodiment 4, mentioned above.

Although a specific explanation has been given of the invention carried out by the inventors based on the embodiments as described above, the invention is not limited to the embodiments but can naturally be changed variously within the range not deviated from the gist.

The method of manufacturing the semiconductor integrated circuit apparatus and the probe card according to the invention can widely be applied in a probe testing step in steps of manufacturing the semiconductor integrated circuit device.

What is claimed is:

1. A method of testing a semiconductor integrated circuit, comprising:

positioning a main face of the semiconductor integrated circuit adjacent to a first side of a probe apparatus, the main face of the semiconductor integrated circuit including a plurality of electrodes, and the first side of the probe apparatus including a sheet with a plurality of metal film portions each having a contact probe;

contacting the plurality of electrodes with corresponding ones of the contact probes; and conducting electrical testing of the semiconductor integrated circuit with the plurality of electrodes in contact with the corresponding contact probes, wherein said contacting includes controlling a pressing apparatus to move the sheet so as to bring the plurality of electrodes into contact with corresponding ones of the contact probes, wherein the sheet further includes a first insulating film, a second insulating film, and a plurality of multi-layered wiring portions each having a first wiring portion and a second wiring portion, the first wiring portion being electrically connected to an associated one of the metal film portions, wherein the first insulating film is formed over the metal film portions, wherein each first wiring portion is formed over the first insulating film and is electrically connected to the associated metal film portion through a first opening formed in the first insulating film, wherein the second insulating film is formed over the first wiring portions, wherein each second wiring portion is formed over the second insulating film and is electrically connected to the corresponding first wiring portion through a second opening formed in the second insulating film, wherein each first wiring portion overlaps the corresponding second wiring portion in plan view, wherein each first wiring portion and corresponding second wiring portion overlap the contact probe of the associated metal film portion in plan view, and wherein each first opening and each second opening do not overlap the contact probe of the associated metal film portion in plan view.

2. The method of claim 1,
wherein a side of the sheet opposite a side having the contact probes includes a portion having no protrusions, and
wherein the pressing apparatus presses the portion of the sheet having no protrusions so as to bring the plurality of electrodes into contact with corresponding ones of the contact probes.

3. The method of claim 1, wherein the first wiring portion and the second wiring portion are formed of plural wiring layers in the sheet.

4. The method of claim 1, wherein the pressing apparatus provides a predetermined force to the sheet at a side opposite to the first side of the probe apparatus so as to bring the plurality of electrodes into contact with corresponding ones of the contact probes.

5. The method of claim 1, wherein the probe apparatus includes a plurality of terminals at a side opposite to the first side of the probe apparatus.

6. The method of claim 5, wherein the plurality of terminals at the side opposite to the first side of the probe apparatus substantially surround the plurality of contact probes in plan view.

7. The method of claim 1, wherein densities of the first and second wiring portions are uniform.

8. The method of claim 1,
wherein widths of the plurality of multi-layered wiring portions are uniform, and
wherein intervals between adjacent ones of the multi-layered wiring portions in plan view are uniform.

9. The method of claim 1,
wherein said integrated semiconductor circuit includes a first integrated semiconductor circuit portion and a second integrated semiconductor circuit portion arranged adjacent to each other, and
wherein said electrical testing is conducted for the first integrated semiconductor circuit portion and for the second integrated semiconductor circuit portion, substantially simultaneously.

10. The method of claim 1, wherein each said metal film portion does not overlap any of the other metal film portions in plan view.

11. The method of claim 1, wherein each first opening does not overlap the associated second opening in plan view.

12. The method of claim 1,
wherein widths of the first wiring portions are uniform,
wherein intervals, in the first direction, between the first wiring portions are uniform, and
wherein intervals, in the first direction, between the second wiring portions are uniform.

13. The method of claim 1,
wherein the metal film portions are spaced from one another in a first direction,
wherein the first wiring portions are spaced from one another in the first direction,
wherein the second wiring portions are spaced from one another in the first direction, and
wherein the first wiring portions and the second wiring portions extend in a second direction perpendicular to the first direction.

14. A method of testing a semiconductor integrated circuit, comprising:
positioning a main face of the semiconductor integrated circuit adjacent to a first side of a probe apparatus, the main face of the semiconductor integrated circuit including a plurality of electrodes, and the first side of the probe apparatus including a sheet with a plurality of elongate metal film portions each having a contact probe;
contacting the plurality of electrodes with corresponding ones of the contact probes; and
conducting electrical testing of the semiconductor integrated circuit with the plurality of electrodes in contact with the corresponding contact probes,
wherein the sheet further includes a first insulating film, a second insulating film, and a plurality of multi-layered wiring portions each having a first wiring portion and a second wiring portion, the first wiring portion being electrically connected to an associated one of the metal film portions,
wherein the first insulating film is formed over the metal film portions,
wherein each first wiring portion is formed over the first insulating film and is electrically connected to the associated metal film portion,
wherein the second insulating film is formed over the first wiring portions,
wherein each second wiring portion is formed over the second insulating film and is electrically connected to the corresponding first wiring portion,
wherein each first wiring portion overlaps the contact probe of the associated metal film portion in plan view such that the first wiring portion extends over the contact probe of the associated metal film portion, with a portion of the first insulating film being arranged therebetween,
wherein each second wiring portion overlaps the contact probe of the associated metal film portion in plan view such that the second wiring portion extends over the contact probe of the associated metal film portion, with the second insulating film being arranged therebetween,
wherein each said contact probe is arranged at a first length wise portion of the associated metal film portion, and each said first wiring portion is electrically connected to a second length wise portion which does not overlap the first length wise portion of the associated metal film portion,
wherein each first wiring portion is coupled to its associated metal film portion at a first coupling portion,
wherein each second wiring portion is coupled to its associated first wiring portion at a second coupling portion, and
wherein each first coupling portion and associated second coupling portion do not overlap each other in plan view.

15. The method of claim 14,
wherein a side of the sheet opposite a side having the contact probes includes a portion having no protrusions, and
wherein a pressing apparatus presses the portion of the sheet having no protrusions so as to bring the plurality of electrodes into contact with corresponding ones of the contact probes.

16. The method of claim 14, wherein the first wiring portion and the second wiring portion are formed of plural wiring layers in the sheet.

17. The method of claim 14, wherein a pressing apparatus provides a predetermined force to the sheet at a side opposite to the first side of the probe apparatus so as to bring the plurality of electrodes into contact with corresponding ones of the contact probes.

18. The method of claim 14, wherein the probe apparatus includes a plurality of terminals at a side opposite the first side of the probe apparatus.

19. The method of claim 18, wherein the plurality of terminals at the side opposite the first side of the probe apparatus substantially surround the plurality of contact probes in plan view.

20. The method of claim 14, wherein densities of the first and second wiring portions are uniform.

21. The method of claim 14,
wherein widths of the plurality of multi-layered wiring portions are uniform, and
wherein intervals between adjacent ones of the multi-layered wiring portions in plan view are uniform.

22. The method of claim 14,
wherein said integrated semiconductor circuit includes a first integrated semiconductor circuit portion and a second integrated semiconductor circuit portion arranged adjacent to each other, and
wherein said electrical testing is conducted for the first integrated semiconductor circuit portion and for the second integrated semiconductor circuit portion, substantially simultaneously.

23. The method of claim 14, wherein each said metal film portion does not overlap any of the other metal film portions in plan view.

24. The method of claim 14,
wherein widths of the first wiring portions are uniform,
wherein intervals, in the first direction, between the first wiring portions are uniform, and
wherein intervals, in the first direction, between the second wiring portions are uniform.

25. The method of claim 14,
wherein the elongate metal film portions are spaced from one another in a first direction,
wherein the first wiring portions are spaced from one another in the first direction,
wherein the second wiring portions are spaced from one another in the first direction, and
wherein the first wiring portions and the second wiring portions extend in a second direction perpendicular to the first direction.

\* \* \* \* \*